United States Patent [19]
Tanigawa

[11] Patent Number: 6,020,644
[45] Date of Patent: Feb. 1, 2000

[54] SEMICONDUCTOR MEMORY DEVICE HAVING BIT LINES AND SIGNAL WIRING LAYERS DIFFERENT IN THICKNESS AND PROCESS OF FABRICATING THEREOF

[75] Inventor: Takaho Tanigawa, Tokyo, Japan

[73] Assignee: NEC Corporation, Tokyo, Japan

[21] Appl. No.: 09/020,603

[22] Filed: Feb. 9, 1998

[30] Foreign Application Priority Data

Feb. 7, 1997 [JP] Japan ..................................... 9-024977

[51] Int. Cl.[7] .................................................. H01L 29/72
[52] U.S. Cl. .............................. 257/775; 257/68; 257/71; 257/296; 257/386; 257/773; 438/258; 438/694; 438/697
[58] Field of Search ................................ 257/68, 71, 296, 257/386, 773, 775; 438/258, 694, 697

[56] References Cited

U.S. PATENT DOCUMENTS 5,801,416  9/1998  Choi et al. ................................. 257/68

FOREIGN PATENT DOCUMENTS 6-91219  11/1994  Japan .

OTHER PUBLICATIONS

Bronner, G. et al., "A Fully Planarized 0.25 um CMOS Technology for 256Mbit DRAM and Beyond", *1995 Symposium on VLSI Technology Digest of Technical Papers*, pp. 15–16.

*Primary Examiner*—Edward Wojciechowicz
*Attorney, Agent, or Firm*—Foley, Hoag & Eliot LLP

[57] ABSTRACT

A semiconductor dynamic random access memory device has a switching transistor fabricated on a first area of a silicon substrate, another switching transistor fabricated on a second area of the silicon substrate and forming a part of a peripheral circuit, a first inter-level insulating structure covering the first and second switching transistors, a bit line formed on the first inter-level insulating structure and electrically connected to the drain region of the first switching transistor, a signal wiring layer formed on the first inter-level insulating structure and electrically connected to the drain region of the second switching transistor, a second inter-level insulating layer covering the bit line and the signal wiring layer and a storage capacitor formed on the second inter-level insulating layer and electrically connected to the drain region of the second switching transistor; parasitic capacitance is the major factor for the signal propagating speed along the bit line, and resistance is the major factor for the signal propagating speed along the signal wiring layer; and the bit line is thinner than the signal wiring layer, because the capacitance between the adjacent bit lines occupies the amount of the parasitic capacitance.

51 Claims, 11 Drawing Sheets

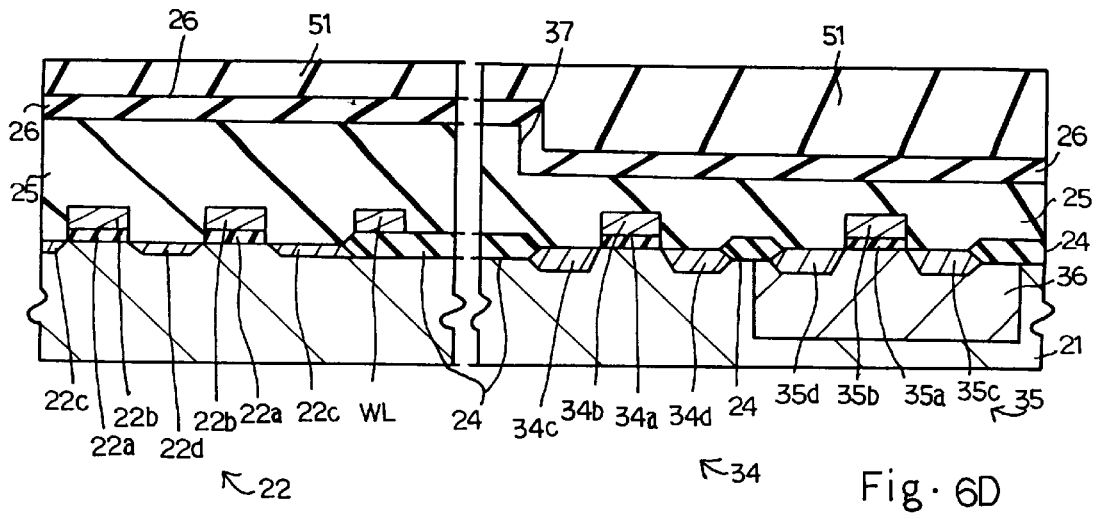
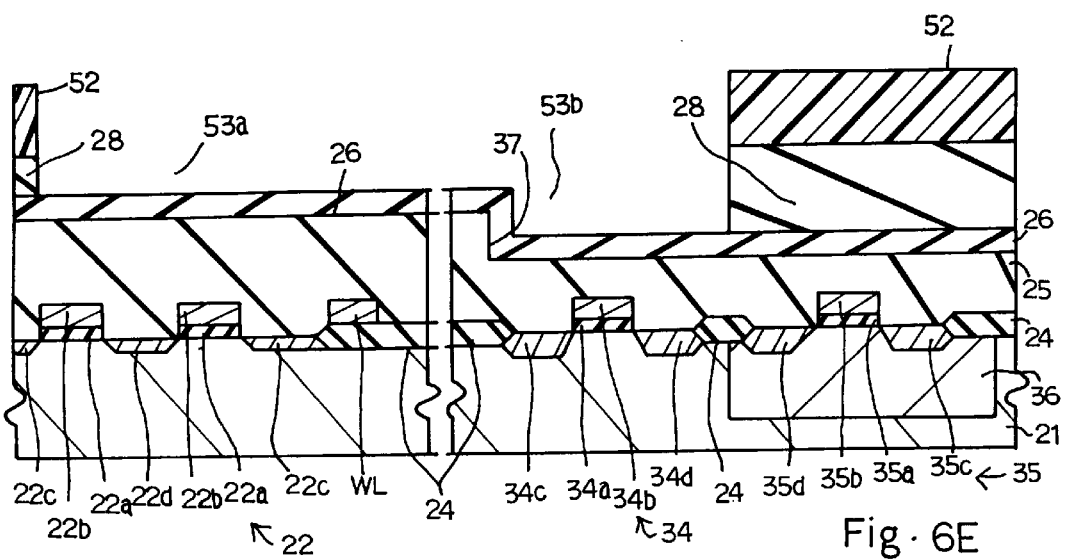
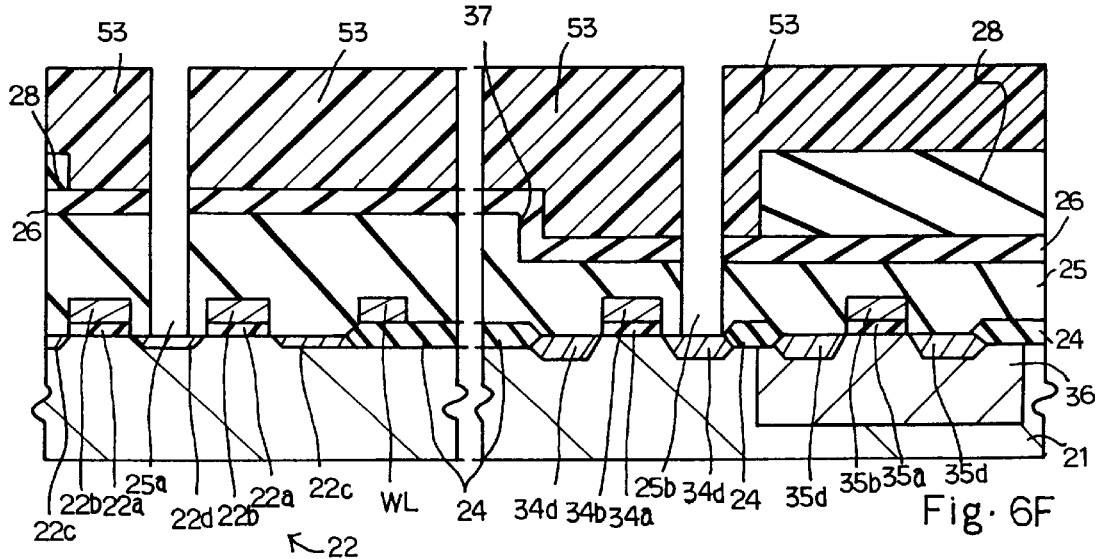

SEMICONDUCTOR MEMORY DEVICE HAVING BIT LINES AND SIGNAL WIRING LAYERS DIFFERENT IN THICKNESS AND PROCESS OF FABRICATING THEREOF

FIELD OF THE INVENTION

This invention relates to a semiconductor memory device and, more particularly, to the structure of a semiconductor memory device having bit lines and signal wiring layers different in thickness and a process of fabricating thereof.

DESCRIPTION OF THE RELATED ART

A semiconductor dynamic random access memory device is broken down into a memory cell array and a peripheral circuit. The memory cell is implemented by a series combination of a switching transistor and a storage capacitor, and the memory cells are fabricated on a silicon substrate together with circuit components of the peripheral circuit. Scale-down, low-power consumption and high-speed data access are basic requirement for the semiconductor dynamic random access memory device. A stacked capacitor and a complementary transistor are appropriate for these requirements.

The switching transistor usually has a MOS (Metal-Oxide-Semiconductor) structure, and includes a gate oxide layer on a channel region formed in a p-type silicon substrate, a gate electrode serving as a word line and source/drain regions formed in the p-type silicon substrate on both sides of the channel region. On the other hand, the stacked capacitor is fabricated over the switching transistor, and includes a storage node electrode, a dielectric film covering the storage node electrode and a cell plate electrode opposite through the dielectric film to the storage node electrode.

The complementary transistor is a major circuit component of the peripheral circuit, and is implemented by a series combination of an n-channel enhancement type field effect transistor and a p-channel enhancement type field effect transistor. The n-channel type field effect transistor is fabricated on a surface portion of the p-type silicon substrate, and has heavily-doped n-type source and drain regions formed in the surface portion, a gate oxide layer on a channel region between the heavily-doped n-type source and drain regions and a gate electrode formed on the gate oxide layer. On the other hand, the p-channel type field effect transistor is fabricated on an n-type well formed in another surface portion of the p-type silicon substrate, and has heavily-doped p-type source and drain regions formed in the n-type well, a gate oxide layer on a channel region between the heavily-doped p-type source and drain regions and a gate electrode formed on the gate oxide layer. The complementary transistor delivers an output signal from the common drain node, i.e., a node between the heavily doped n-type drain region and the heavily-doped p-type drain region.

A typical example of the semiconductor dynamic random access memory device is disclosed in Japanese Patent Publication of Examined Application No. 6-91219. FIGS. 1A to 1E illustrate the fabrication process for the prior art semiconductor dynamic random access memory device.

The prior art process starts with preparation of a p-type silicon substrate 1, and an n-type well (not shown) is formed in a surface portion of the p-type silicon substrate 1. A field oxide layer 2 is selectively grown on the p-type silicon substrate 1 and the n-type well through the LOCOS (local oxidation of silicon) process, and defines active areas assigned to a pair of dynamic random access memory cells and a complementary transistor. In this instance, the pair of dynamic random access memory cells is fabricated on the left side, and the complementary transistor is fabricated on the right side.

The active areas are thermally oxidized so as to grow gate oxide layers 3a, 3b, 4a and 4b on the active area. Conductive material is deposited over the entire surface of the resultant semiconductor structure, and the conductive material layer is patterned into word lines 3c, 3d and 3e. The word lines 3c to 3e on the gate oxide layers 3a/3b serve as gate electrodes, which are labeled with the same references as those of the word lines 3c–3e. N-type dopant impurity is ion implanted into the active areas, and lightly-doped n-type source/drain regions 3f/3g are formed in the active area is a self-aligned manner with the gate electrodes 3c/3d.

On the other hand, gate electrodes 4c/4d are formed on the gate oxide layers 4a/4b, respectively, and the active areas assigned to the p-channel enhancement type field effect transistor and the memory cells are covered with a photo-resist ion-implantation mask (not shown). N-type dopant impurity such as phosphorous or arsenic is ion implanted into the active areas assigned to the n-channel enhancement type field effect transistors so as to form heavily-doped source and drain regions 4e/4f/4g/4h in a self-aligned manner with the gate electrodes 4c/4d. The photo-resist ion-implantation mask is stripped off, and the active areas assigned to the memory cells and the n-channel enhancement type field effect transistors are covered with another photo-resist ion-implantation mask (not shown). P-type dopant impurity such as boron difluoride is ion implanted into the active area, and heavily-doped p-type source and rain regions (not shown) are formed in the active areas in a self-aligned manner with the gate electrode. The resultant semiconductor structure is shown in FIG. 1A.

Silicon oxide is deposited over the entire surface of the resultant semiconductor structure, and forms an inter-level insulating layer 5. The inter-level insulating layer 5 provides a smooth top surface. A photo-resist etching mask 6 is patterned on the top surface of the inter-level insulting layer 5, and the inter-level insulating layer 5 is anisotropically etched away so as to form contact holes in the inter-level insulating layer 5. The lightly-doped n-type source region 3f and the heavily-doped n-type source regions 4f/4g are exposed to certain contact holes 6a/6b/6c, respectively, as shown in FIG. 1B.

The photo-resist etching mask 6 is stripped off. Conductive material is deposited to 200 nanometers thick over the entire surface of the resultant semiconductor structure, and is tungsten silicide or has a tungsten polyside structure. The conductive material fills the contact holes 6a–6c, and swells into a conductive layer over the inter-level insulating layer 5. A photo-resist etching mask (not shown) is patterned on the conductive layer, and the conductive layer is selectively etched away so as to form a bit line 7a and a signal line 7b as shown in FIG. 1C. The bit line 7a passes through the contact hole 6a, and is held in contact with the lightly-doped n-type drain region 3f. On the other hand, the signal line 7b passes through the contact holes 6b/6c, and is held in contact with the heavily-doped n-type source/drain regions 4f/4g.

Subsequently, insulating material in the silicon oxide system is deposited over the entire surface of the resultant semiconductor structure, and forms an inter-level insulating layer 8. The inter-level insulating layer 8 provides a smooth top surface. A photo-resist etching mask 9 is patterned on the inter-level insulating layer 8, and the inter-level insulating layers 8 and 5 are anisotropically etched away so as to form a node contact hole 9a as shown in FIG. 1D. The lightly-doped source region 3g is exposed to the node contact hole 9a.

Heavily-doped n-type polysilicon is deposited to 700 nanometers thick over the entire surface of the inter-level insulating layer 8. The heavily-doped n-type polysilicon fills the storage node contact 9a, and swells into a heavily-doped n-type polysilicon layer over the inter-level insulating layer 8.

A photo-resist etching mask (not shown) is patterned on the heavily-doped n-type polysilicon layer, and the heavily-doped n-type polysilicon layer is selectively etched away so as to form a storage node electrode 10 on the inter-level insulating layer 8. The storage node electrode 10 passes through the storage node contact 9a, and is held in contact with the lightly-doped n-type source 3g.

The resultant semiconductor structure is cleaned, and natural oxide is removed from the storage node electrode 10 in buffered hydrofluoric acid. Silicon nitride is deposited to 7 nanometers thick over the storage node electrode 10, and the silicon nitride layer is partially oxidized in wet ambience at 800 degrees in centigrade. Thus, the silicon nitride film is partially converted to a silicon oxide film. Finally, heavily-doped n-type polysilicon is deposited to 150 nanometers thick over the entire surface of the resultant semiconductor structure, and the composite layer of silicon nitride and silicon oxide and the heavily-doped n-type polysilicon layer are successively patterned into a dielectric layer 11 and a cell plate electrode 12 as shown in FIG. 1E.

Thereafter, an inter-level insulating layer, contact holes, metal wiring layers and a passivation layer are successively formed on the resultant semiconductor structure, and the semiconductor dynamic random access memory device is completed.

The prior art process disclosed in Japanese Patent Publication of Examined Application No. 6-91219 is appropriate for the scale-down of the memory cells. However, the prior art process can not reduce both of the parasitic capacitance coupled to the bit line 7a and the resistance of the signal line 7b, and the manufacturer can not achieve a low-power consumption and a high-speed data access.

In detail, FIG. 2 shows the dependency of parasitic capacitance coupled to the bit line 7a on the thickness of the bit line 7a, and FIG. 3 shows the dependency of resistance in the signal line 7b on the thickness of the signal line 7b. The bit lines 7a were formed of tungsten silicide, and were patterned at intervals of 0.35 micron. The bit lines 7a were 200 microns long and 0.35 micron in width. The signal line 7b was also formed of the tungsten silicide, and was 100 microns long and 1 micron in width.

The thickness of the bit lines 7a was changed, and the parasitic capacitance was plotted as shown in FIG. 2. The parasitic capacitance was increased together with the thickness of the bit line 7a. When the bit lines 7a were arranged at narrow intervals, the parasitic capacitance between the bit lines 7a was never ignoreable, and the fringe capacitance was increased together with the thickness. On the other hand, the resistance of the signal line 7b was inversely proportional to the thickness of the signal line 7b as shown in FIG. 3.

From FIG. 2, it is desirable for the bit lines 7a to decrease the thickness thereof. On the other hand, FIG. 3 teaches that a thicker signal line is desirable for high-speed signal propagation. Thus, there is a trade-off between the resistance of the signal line 7b and the parasitic capacitance of the bit lines 7a. However, the prior art process makes the bit lines 7a and the signal line 7b simultaneously patterned. For this reason, the bit lines 7a are large in parasitic capacitance, or the signal line 7b provides large resistance against signals. This results in large current consumption and low data access speed.

SUMMARY OF THE INVENTION

It is therefore an important object of the present invention to provide a semiconductor memory device, which is improved in current consumption and data access speed.

It is also an important object of the present invention to provide a process of fabricating a semiconductor memory device, which has bit lines and a signal line concurrently patterned from a conductive layer and different in thickness without sacrifice of a flat upper surface.

To accomplish the object, the present invention proposes to give form a bit line and a signal wiring layer in grooves different in depth.

In accordance with one aspect of the present invention, there is provided a semiconductor memory device fabricated on a semiconductor substrate, and the semiconductor memory device comprises a data storage means fabricated on a first portion of the semiconductor substrate for storing data information, a peripheral circuit fabricated on a second portion of the semiconductor substrate for controlling a data access to the data storage means, a first inter-level insulating structure formed on the first portion and the second portion of the semiconductor substrate and having a plurality of contact holes reaching a first port of the data storage means assigned to a first signal representative of the data information and a second port of the peripheral circuit assigned to a second signal, a first conductive path extending on the first inter-level insulating structure over the first portion, electrically connected to the first port and having a first thickness and a first upper surface, and a second conductive path extending on the first inter-level insulating structure over the second portion, electrically connected to the second port and having a second thickness greater than the first thickness and a second upper surface substantially coplanar with the first upper surface.

In accordance with another aspect of the present invention, there is provided a process for fabricating a semiconductor dynamic random access memory device comprising the steps of preparing a semiconductor substrate, fabricating a first kind of circuit component incorporated in a data storage means and a second kind of circuit component incorporated in a peripheral circuit on a first portion of the semiconductor substrate and a second portion of the semiconductor substrate, respectively, covering the first kind of circuit component and the second kind of circuit component with a first inter-level insulating structure having a step making the first inter-level insulating structure different in thickness between a first portion over the first portion of the semiconductor substrate and the second portion over the second portion of the semiconductor substrate, forming a second inter-level insulating layer on the first inter-level insulating layer, forming a first groove with a first depth located over the first portion of the first inter-level insulating structure, a second groove with a second depth greater than the first depth and located over the second portion of the first inter-level insulating structure, a first contact hole connecting the first groove to a first port of the first kind of circuit component and a second contact hole connecting the second groove to a second port of the second kind of circuit component in the second inter-level insulating layer, depositing conductive material in such a manner as to fill the first groove and the second groove and swell into a conductive layer on the second inter-level insulating layer, and uniformly removing the conductive layer until the second inter-level insulating layer is exposed, thereby leaving a first conductive path and a second conductive path different in thickness in the first groove and the second groove, respectively.

BRIEF DESCRIPTION OF THE DRAWINGS

The features and advantages of the semiconductor memory device and the process will be more clearly understood from the following description taken in conjunction with the accompanying drawings in which:

FIGS. 6A to 6H are cross sectional views showing a process for fabricating the semiconductor dynamic random access memory device;

DESCRIPTION OF THE PREFERRED EMBODIMENTS

First Embodiment

Figure 1A:
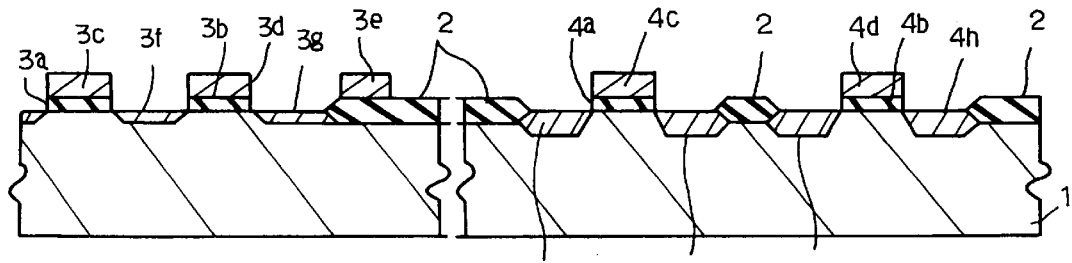
FIGS. 1A to 1E are cross sectional views showing the prior art process for fabricating the semiconductor dynamic random access memory device.
Figure 1B:
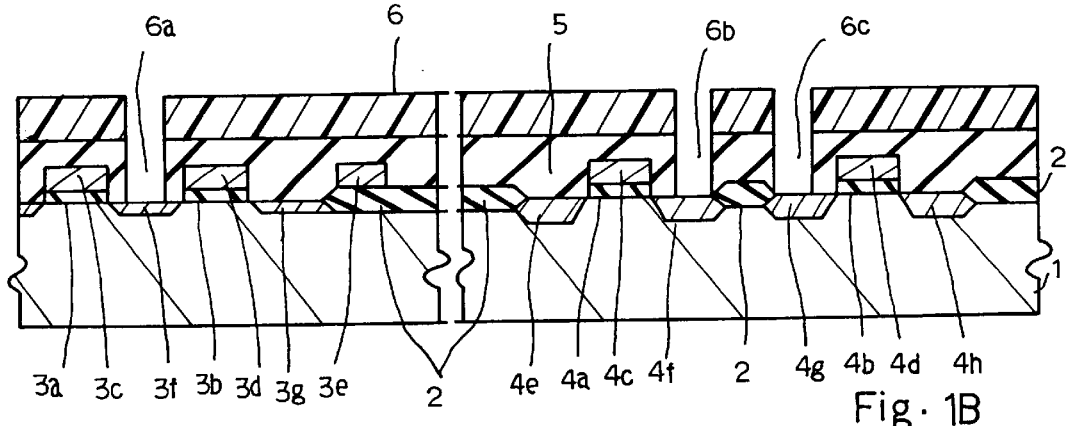
Figure 1C:
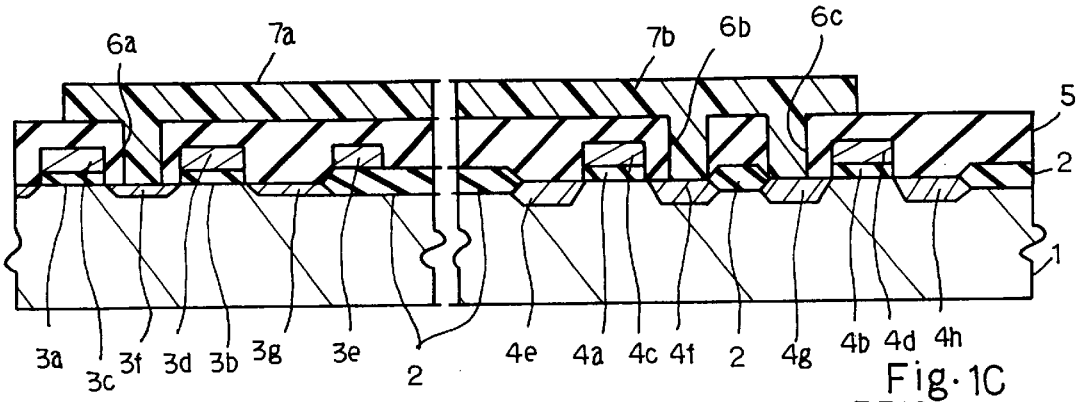
Figure 1D:
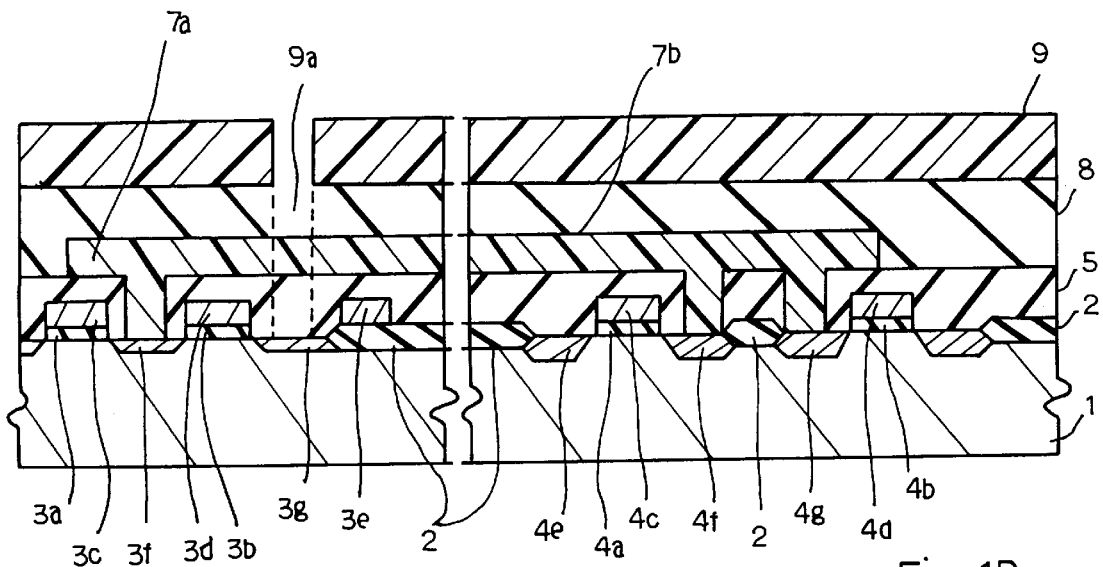
Figure 1E:
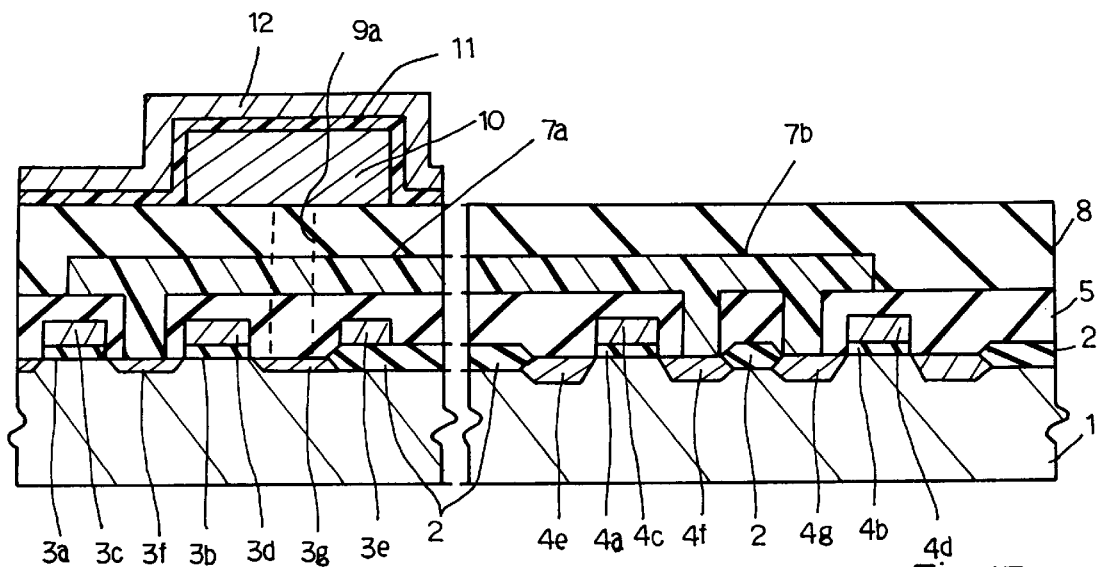
Figure 2:
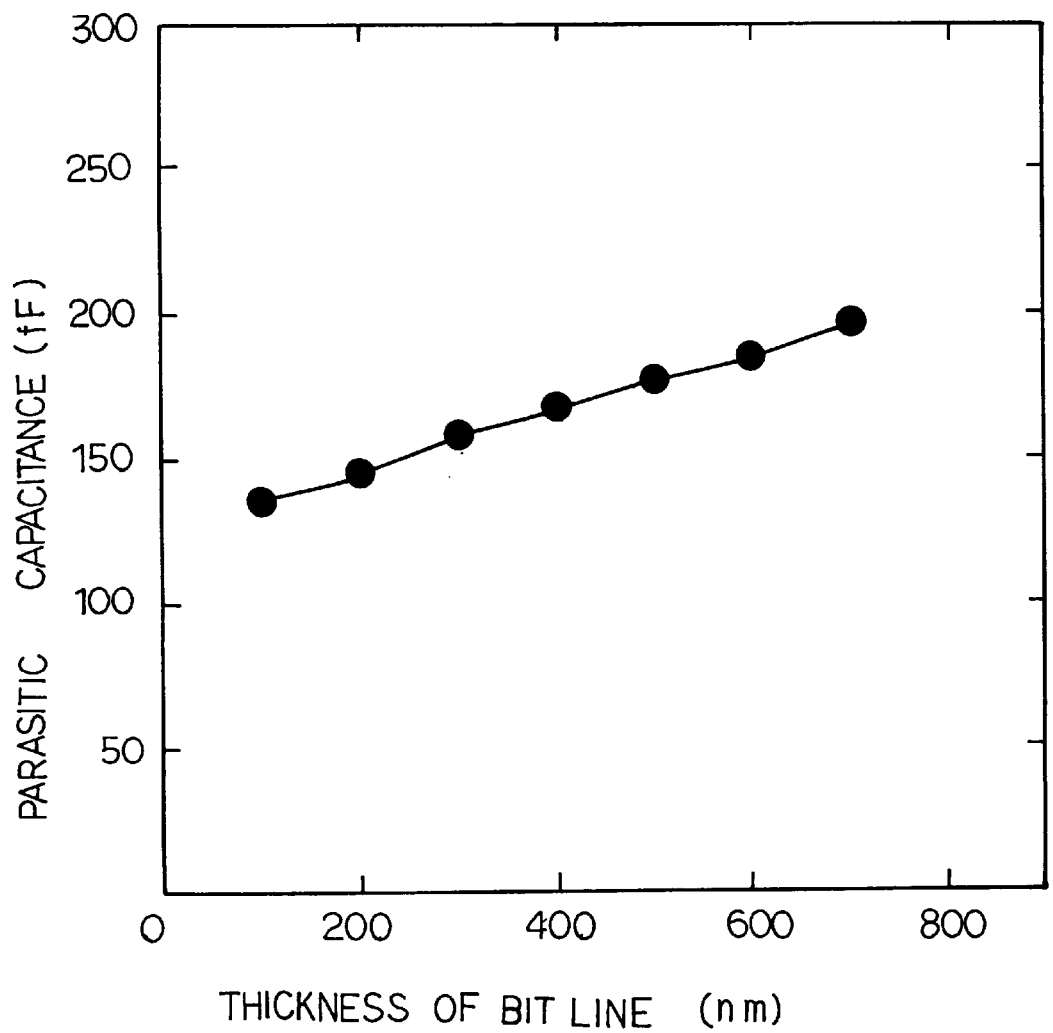
FIG. 2 is a graph showing the parasitic capacitance coupled to the bit line in terms of the thickness of the bit line.
Figure 3:
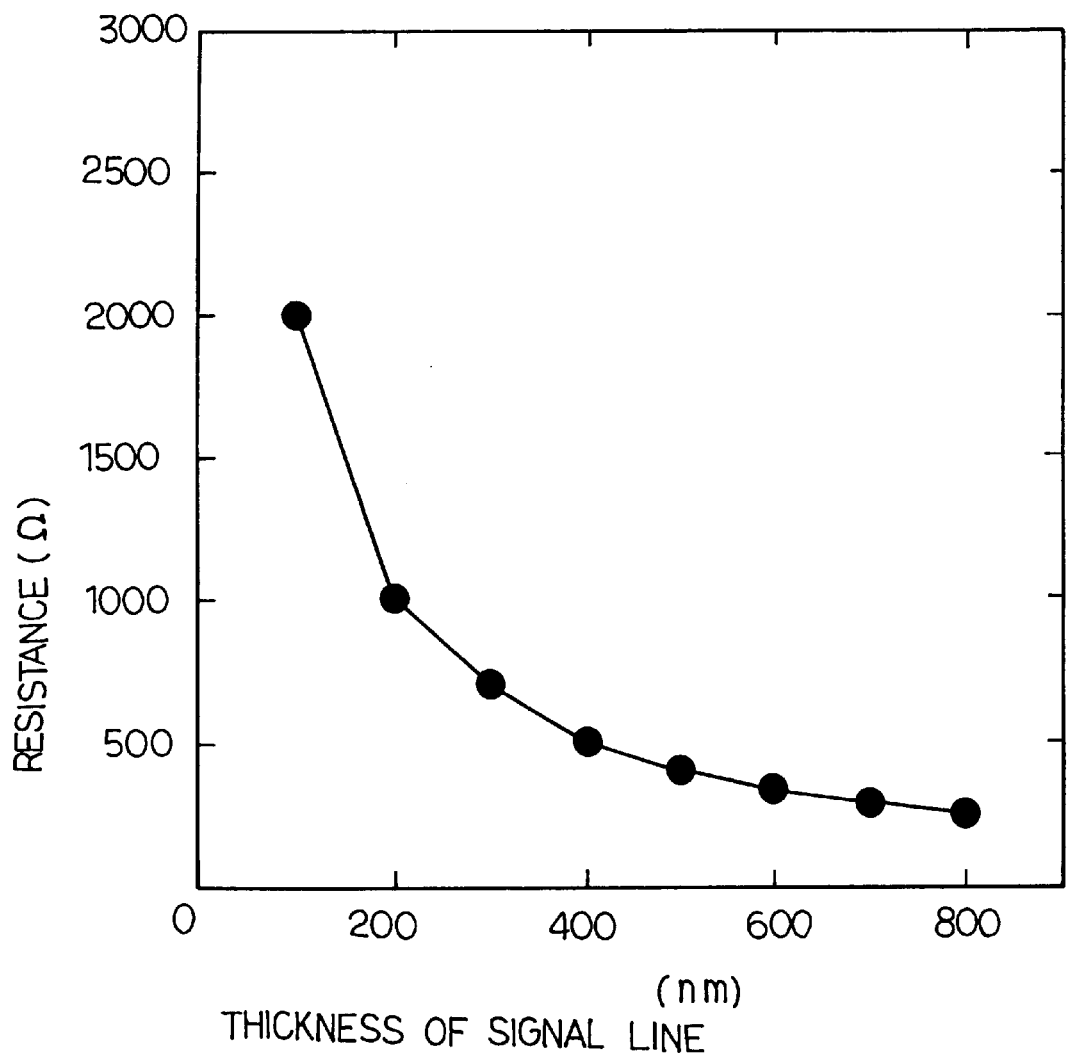
FIG. 3 is a graph showing the resistance of the signal wiring in terms of the thickness of the signal line.
Figure 4:
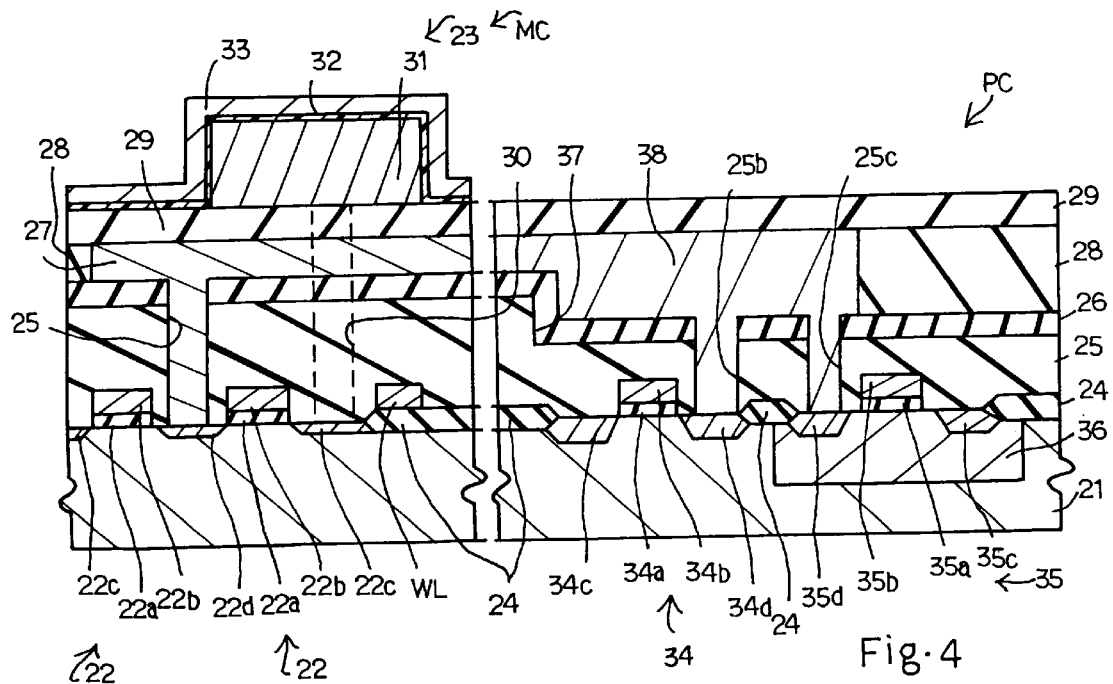
FIG. 4 is a cross sectional view showing the structure of a semiconductor dynamic random access memory device according to the present invention.

Referring to FIG. 4 of the drawings, a semiconductor dynamic random access memory device embodying the present invention is fabricated on a p-type silicon substrate 21. The semiconductor dynamic random access memory device largely comprises a memory cell array and a peripheral circuit PC. A large number of memory cells MC form the memory cell array, and store data bits in a rewritable manner. The peripheral circuit selectively connects a data input/output port to the memory cells MC, and writes data bits into and reads out the data bits from the memory cell array. In this instance, the memory cell array is assigned to the left portion of the p-type silicon substrate 21, and the peripheral circuit PC is assigned to the right portion of the p-type silicon substrate 21. The peripheral circuit PC controls a data access to the memory cell array as well known to a person skilled in the art.

The memory cells MC are similar in circuit configuration to one another, and each memory cell MC is implemented by a series combination of an n-channel enhancement type field effect transistor 22 and a stacked-type storage capacitor 23. A thick field oxide layer 24 is selectively grown on the major surface of the p-type silicon substrate 21, and defines a plurality of active areas. A pair of memory cells MC is assigned to one of the active areas on the left portion.

The n-channel enhancement type field effect transistor 22 is fabricated on the active area, and includes a gate insulating layer 22a formed on a channel region in the active area, a gate electrode 22b on the gate insulating layer 22a and lightly-doped n-type source/drain regions 22c/22d. The gate electrode 22b forms a part of a word line WL. The n-channel enhancement type field effect transistors 22 are covered with a first inter-level insulating layer 25, and a silicon nitride layer 26 is laminated on the first inter-level insulating layer 25. As will be described in conjunction with the peripheral circuit PC, the first inter-level insulating layer 25 is difference in thickness between the left portion over the memory cell array and the right portion over the peripheral circuit PC. The left portion is thicker than the right portion. The silicon nitride layer 26 is uniform in thickness, and conformably extends over the left portion and the right portion.

A bit contact hole 25a is formed in the first inter-level insulating layer 25 and the silicon nitride layer 26, and the lightly-doped n-type drain region 22d is exposed to the contact hole 25a. A bit line 27 extends over the silicon nitride 26, and is electrically connected through the bit contact hole 25a to the lightly-doped n-type drain region 22d. In this instance, the bit line 27 is formed of tungsten silicide. The bit line 27 may have a polyside structure, i.e., a lamination of refractory metal silicide film and polysilicon film. The bit line 27 is relatively thin, and is embedded in a second inter-level insulating layer 28. In this instance, the bit line 27 is 200 nanometers thick, and has the width of 0.35 micron. Though not shown in FIG. 4, the bit lines 27 are arranged at intervals, and the interval is as narrow as 0.35 micron. The second inter-level insulating layer 28 has a relatively thin left portion and a relatively thick right portion, and the upper surface of the left portion is substantially coplanar with the upper surface of the bit line 27. The bit line 27 and the second inter-level insulating layer 28 are covered with a third inter-level insulating layer 29.

The stacked-type storage capacitor 23 includes a storage node electrode 31, a dielectric layer 32 and a cell plate electrode 33. A node contact hole 30 is formed in the first inter-level insulating layer 25, the silicon nitride layer 26, the second inter-level insulating layer 28 and the third inter-level insulating layer 29, and the lightly-doped n-type source region 22c is exposed to the node contact hole 30. The storage node electrode 31 is formed on the third inter-level insulating layer 29, and is electrically connected through the node contact hole 30 to the lightly-doped n-type source region 22c. The storage node electrode 31 is covered with the dielectric layer 32, and the cell plate electrode 33 is opposed through the dielectric layer 32 to the storage node electrode 31.

Complementary transistors are a major circuit component of the peripheral circuit PC. One of the complementary transistors is assigned to the active areas on the right portion of the p-type silicon substrate 21. The complementary transistor is implemented by a combination of an n-channel enhancement type field effect transistor 34 and a p-channel enhancement type field effect transistor 35. The left active area is assigned to the n-channel enhancement type field effect transistor 34, and the right active area is assigned to the p-channel enhancement type field effect transistor 35.

The n-channel enhancement type field effect transistor 34 includes a gate insulating layer 34a, a gate electrode 34b formed on the gate insulating layer 34a and heavily-doped n-type source/drain regions 34c/34d. On the other hand, an n-type well 36 is formed in the right active area, and the p-channel enhancement type field effect transistor 35 includes a gate insulating layer 35a, a gate electrode 35b formed on the gate insulating layer 35a and heavily-doped p-type source/drain regions 35c/35d.

The n-channel enhancement type field effect transistor 34 and the p-channel enhancement type field effect transistor 35 are covered with the right portion of the first inter-level insulating layer 25. The right portion is thinner than the left portion, and a step 37 is formed between the left portion and the right portion. Contact holes 25b/25c are formed in the first inter-level insulating layer 25 and the silicon nitride layer 26, and the heavily-doped n-type drain region 34d and the heavily-doped p-type drain region 35d are exposed to the contact holes 25b/25c, respectively.

A signal wiring layer 38 extends on the silicon nitride layer 26, and is electrically connected through the contact holes 25b/25c to the heavily-doped n-type drain region 34d and the heavily-doped p-type drain region 35d. The signal wiring layer 38 is formed of the tungsten silicide, and the bit line 27 and the signal wiring layer 38 are patterned from a tungsten silicide layer. The signal wiring layer 38 may have the silicide structure and patterned from the lamination of refractory metal silicide film and polysilicon film together with the bit line 27. The signal wiring layer 38 conformably extends on the silicon nitride layer 26, and is embedded in the second inter-level insulating layer 28. The upper surface of the second inter-level insulating layer 29 is coplanar with the upper surface of the signal wiring layer 38, and, for this reason, the signal wiring layer 38 is thicker than the bit line 27. In this instance, the signal wiring layer 38 is 500 nanometers thick, and ranges from 0.35 micron to 0.8 micron wide. The signal wiring layer 38 is spaced from other signal wiring layers by 0.35 micron to 10 microns. The signal wiring layer 38 and the second inter-level insulating layer 29 are overlain by the third inter-level insulating layer 29.

Figure 5:
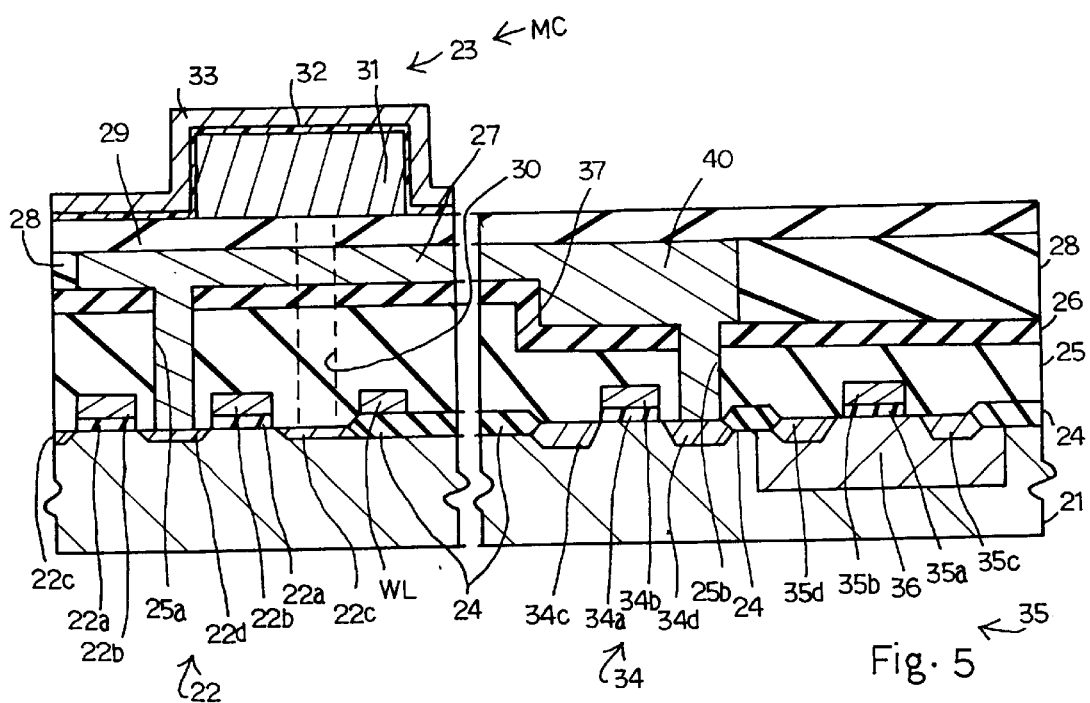
FIG. 5 is a cross sectional view showing a modification of the semiconductor dynamic random access memory device according to the present invention.

In another implementation, a signal wiring layer 40 is directly connected to the heavily-doped n-type drain region 34d, only, as shown in FIG. 5. The p-channel enhancement type field effect transistor 35 is connected through another conductive line to the signal wiring layer 38. Otherwise, the p-channel enhancement type field effect transistor 35 may be independently used in the peripheral circuit.

As will be appreciated from the foregoing description, the first inter-level insulating layer 25 is different in thickness between the left portion and the right portion, and the upper surface of the bit line 27 is coplanar with the upper surface of the signal wiring layer 38. This results in that the bit line 27 is rather thin than the signal wiring layer 38. For this reason, a small amount of parasitic capacitance is coupled to the bit line 27, and the signal wiring layer 38 is small in resistance. The bit line 27 is coupled with a small amount of parasitic capacitance, and the signal wiring layer 38 is small in resistance. The bit line 27 and the signal wiring layer 38 propagate signals at high speed, and the small amount of parasitic capacitance reduces the power consumption of the semiconductor dynamic random access memory device.

FIGS. 6A to 6H illustrate a process for fabricating the semiconductor dynamic random access memory device shown in FIG. 5. The process starts with preparation of the p-type silicon substrate 21, and the n-type well 36 is formed in the right portion of the p-type silicon substrate 21. The thick field oxide layer 24 is selectively grown to 300 nanometers thick on the p-type silicon substrate 21 and the n-type well 36 by using the LOCOS techniques, and defines the active areas. The active areas are thermally oxidized, and the gate insulating layers 22a, 34a and 35a are grown to 8 nanometers to 20 nanometers thick on the active areas.

Heavily-doped n-type polysilicon is deposited to 200 nanometers thick over the entire surface of the resultant semiconductor structure. Photo-resist solution is spun onto the heavily-doped n-type polysilicon layer, and is baked so as to form a photo-resist layer. A pattern image for gate electrodes is transferred to the photo-resist layer, and forms a latent image for the gate electrodes in the photo-resist layer. The latent image is developed, and the photo-resist layer is formed into a photo-resist etching mask (not shown). In this way, the photo-resist etching mask is patterned on the polysilicon layer by using photo-lithographic techniques.

Using the photo-resist etching mask, the polysilicon layer is selectively etched away, and the word lines WL and the gate electrodes 34b/35b are formed. The word lines WL on the gate insulating layers 22a serve as gate electrodes 22b.

A photo-resist ion implantation mask (not shown) is patterned on the resultant semiconductor structure. The photo-resist ion implantation mask covers the active areas assigned to the peripheral circuit PC. Phosphorous is ion implanted into the active areas at dose of $1 \times 10^{13}$ cm$^{-2}$ to $5 \times 10^{13}$ cm$^{-2}$ under acceleration energy of 40 keV, and lightly-doped n-type source/drain regions 22c/22d are formed in the active areas in a self-aligned manner with the gate electrodes 22b. The photo-resist ion implantation mask is stripped off, and the gate insulating layer 22a, the gate electrode 22b and the lightly-doped n-type source/drain regions 22c/22d as a whole constitute the n-channel enhancement type field effect transistor 22.

Another photo-resist ion implantation mask (not shown) in patterned on the resultant semiconductor structure. The photo-resist ion implantation mask covers the active areas assigned to the memory cells MC and the n-type well 36, and the active area assigned to the n-channel enhancement type field effect transistor 34 is exposed to an opening of the photo-resist ion implantation mask. Phosphorous or arsenic is ion implanted into the active area $3 \times 10^{15}$ cm$^{-2}$ under acceleration energy of 50 keV, and the heavily-doped n-type source/drain regions 34c/34d are formed in the active area in a self-aligned manner with the gate electrode 34b. The gate insulating layer 34a, the gate electrode 34b and the heavily-doped n-type source/drain regions 34c/34d as a whole constitute the n-channel enhancement type field effect transistor 34. The photo-resist ion implantation mask is stripped off.

Figure 6A:
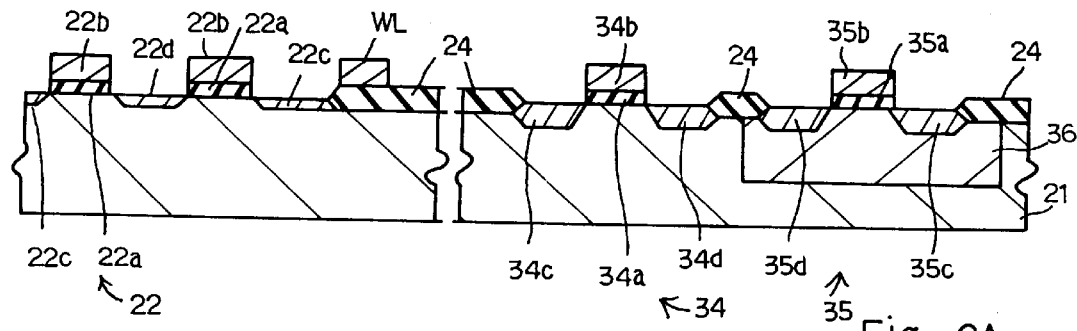

Yet another photo-resist ion implantation mask (not shown) is patterned on the resultant semiconductor structure. The photo-resist ion implantation mask covers the active areas assigned to the memory cells MC and the n-channel enhancement type field effect transistor 34, and the active area assigned to the p-channel enhancement type field effect transistor 35 is exposed to an opening of the photo-resist ion implantation mask. Boron or boron difluoride is ion implanted into the active area $3 \times 10^{15}$ cm$^{-2}$ under acceleration energy of 50 keV, and the heavily-doped p-type source/drain regions 35c/35d are formed in the active area in a self-aligned manner with the gate electrode 35b. The gate insulating layer 35a, the gate electrode 35b and the heavily-doped p-type source/drain regions 35c/35d as a whole constitute the p-channel enhancement type field effect transistor 35. The photo-resist ion implantation mask is stripped off. The resultant semiconductor structure is shown in FIG. 6A.

Subsequently, insulating material in silicon oxide system is deposited over the entire surface of the resultant semiconductor structure, and forms the first inter-level insulating layer 25. In this instance, the insulating material in the silicon oxide system is silicon oxide and boro-phosphosilicate glass. The resultant semiconductor structure is placed in a reactor of a low-pressure chemical vapor deposition system, gaseous mixture containing silane ($SiH_4$) and dinitrogen monoxide ($N_2O$) is introduced in reactor. The silane is pyrolized at 800 degrees in centigrade, and silicon oxide is deposited to 100 nanometers thick over the entire surface of the resultant semiconductor structure. Subsequently, gaseous mixture containing tetraethyl ortho-silicate ($Si(OC_2H_5)_4$), phosphine ($PH_3$), trimethyl borate ($B(OCH_3)_3$) and oxygen ($O_2$) is introduced into the reactor, and boro-phosphosilicate glass is deposited to 800 nanometers thick over the silicon oxide layer. The boro-phosphosilicate glass layer is reflowed at 750 degrees to 900 degrees in centigrade, and the boro-phosphosilicate glass layer is 300 nanometers decreased in thickness by using a chemical mechanical polishing. In this way, the first inter-level insulating layer 25 is formed on the resultant semiconductor structure shown in FIG. 6A.

Figure 6B:
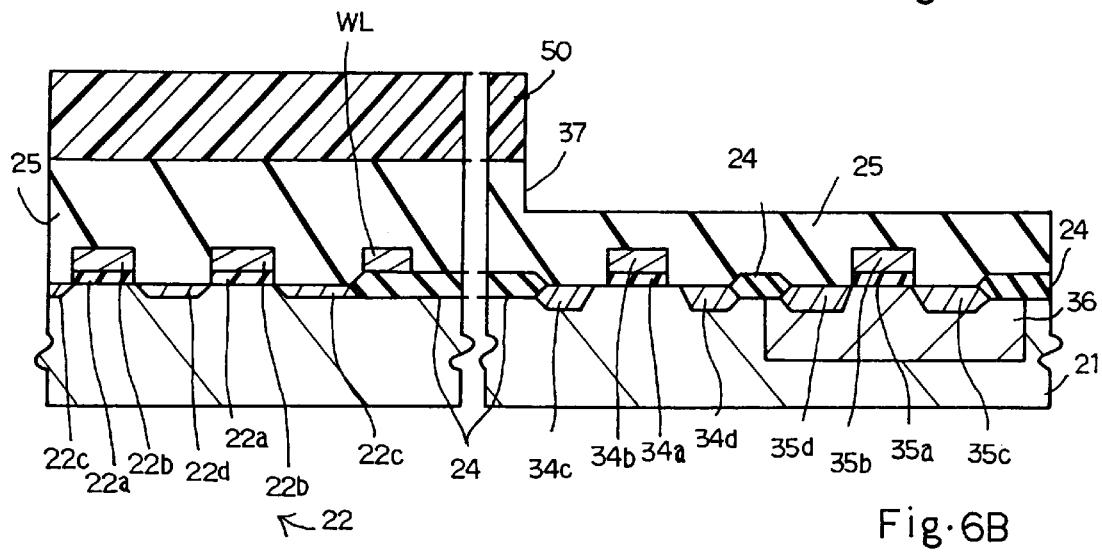

A photo-resist etching mask 50 is patterned on the first inter-level insulating layer 25, and the right portion of the first inter-level insulating layer 25 is uncovered with the photo-resist etching mask 50. The boro-phosphosilicate glass layer is selectively etched away by 300 nanometers thick. A wet etching using buffered hydrofluoric acid or an anisotropic etching using etching gas in fluoro-carbon system is available for the selective etching. As a result, the step 37 of 300 nanometers takes place as shown in FIG. 6B.

Figure 6C:
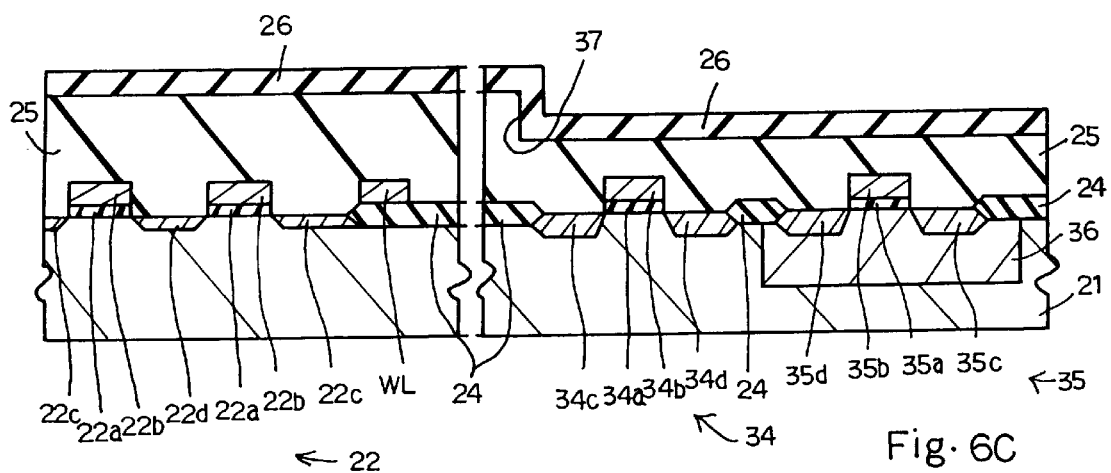

The photo-resist etching mask 50 is stripped off, and silicon nitride is deposited to 100 nanometers thick by using a low-pressure chemical vapor deposition, and the silicon nitride layer 26 is conformally formed on the first inter-level insulating layer 25 as shown in FIG. 6C.

Boro-phosphosilicate glass is deposited to 500 nanometers thick over the entire surface of the resultant semiconductor structure shown in FIG. 6C by using the low-pressure chemical vapor deposition, and the boro-phosphosilicate glass is reflowed. The boro-phosphosilicate glass layer is chemically mechanically polished by 300 nanometers, and is planarized as shown in FIG. 6D.

A photo-resist etching mask 51 is patterned on the boro-phosphosilicate glass layer 51 by using the photo-lithographic techniques, and defines a pattern for the bit line 27 and the signal wiring layer 40. Using the photo-resist etching mask 51, the boro-phosphosilicate glass layer 51 is selectively etched away by using an anisotropic etching technique, and is patterned into the second inter-level insulating layer 28. The silicon nitride layer 26 serves as an etching stopper during the anisotropic etching, and the etchant is expected to have large selectively to the silicon nitride. In this instance, the etchant is in the fluoro-carbon system, and has the selectivity of the order of 18. If a magnetron reactive ion etching is used for the anisotropic etching, the etchant contains $CHF_3$ and CO, and the flow rate $CHF_3$/CO is regulated to 20 sccm/80 sccm. The power is 600 watts, the pressure is 8 Pa, and the magnetic field is 400 gauss.

Grooves 53a/53b are formed in the second inter-level insulating layer 28 as shown in FIG. 6E, and are 200 nanometers deep over the memory cells MC and 500 nanometers over the n-channel enhancement type field effect transistor 34. The photo-resist etching mask 52 is stripped off.

Another photo-resist etching mask 53 is patterned on the second inter-level insulating layer 28 and the silicon nitride layer 26, and has openings over the lightly-doped n-type drain region 22d and the heavily-doped n-type drain region 34d. The silicon nitride layer 26 and the first inter-level insulating layer 25 are anisotropically etched away so as to form the contact holes 25a/25b as shown in FIG. 6F.

Subsequently, tungsten silicide is deposited over the entire surface of the resultant semiconductor structure by using a sputtering technique or a low-pressure chemical vapor deposition. The tungsten silicide fills the contact holes 25a/25b and the grooves 53a/53b, and swells into a tungsten silicide layer of 800 nanometers thick over the second inter-level insulating layer 28.

If the polyside structure is required for the bit line 27 and the signal wiring layer 40, a heavily-doped n-type polysilicon layer is deposited to 100 nanometers thick by using a low-pressure chemical vapor deposition, and a tungsten silicide layer of 700 nanometers thick is laminated on the heavily-doped n-type polysilicon layer.

Figure 6G:
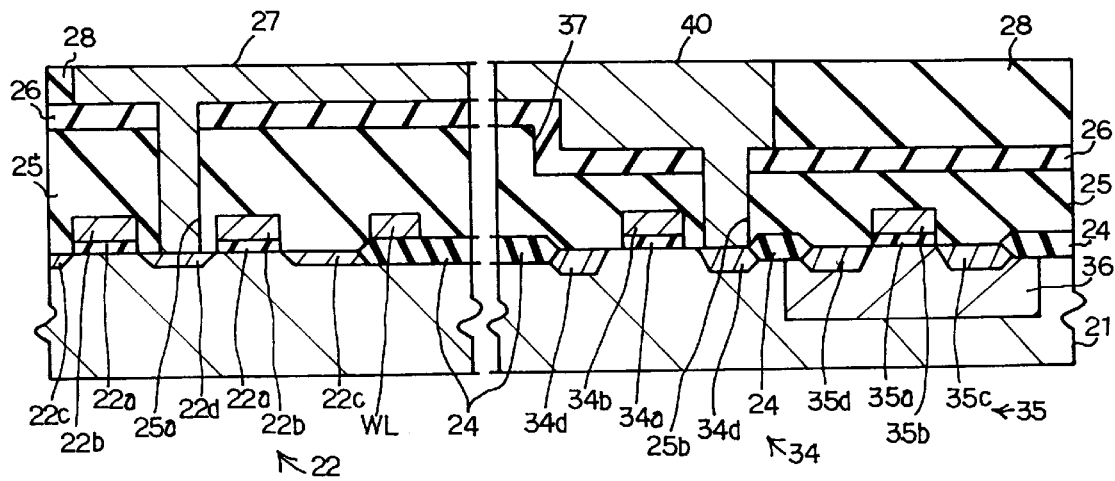

The tungsten silicide layer is chemically mechanically polished until the second inter-level insulating layer 28 is exposed again. Then, the bit line 27 is embedded in the groove 53a, and the signal wiring layer 40 is embedded in the groove 53b as shown in FIG. 6G.

Insulating material in the silicon oxide system is deposited over the entire surface of the resultant semiconductor structure, and forms the third inter-level insulating layer 29, and the third inter-level insulating layer 29 is planarized. A photo-resist etching mask (not shown) is patterned on the third inter-level insulating layer 29 by using the photo-lithographic techniques, and the third inter-level insulating layer 29, the second inter-level insulating layer 28, the silicon nitride layer 26 and the first inter-level insulating layer 25 are anisotropically etched away so as to form the node contact hole 30. The lightly-doped n-type source region 22c is exposed to the node contact hole 30.

Subsequently, heavily-doped n-type polysilicon is deposited over the entire surface of the resultant semiconductor structure. The heavily-doped n-type polysilicon fills the node contact hole 30, and swells into a heavily-doped n-type polysilicon layer of 700 nanometers thick on the third inter-level insulating layer 29. A photo-resist etching mask (not shown) is patterned on the heavily-doped n-type polysilicon layer by using the photo-lithographic techniques, and the heavily-doped n-type polysilicon layer is patterned into the storage node electrode 31. The storage node electrode 31 is electrically connected through the node contact hole 30 to the lightly-doped n-type source region 22c.

Figure 6H:
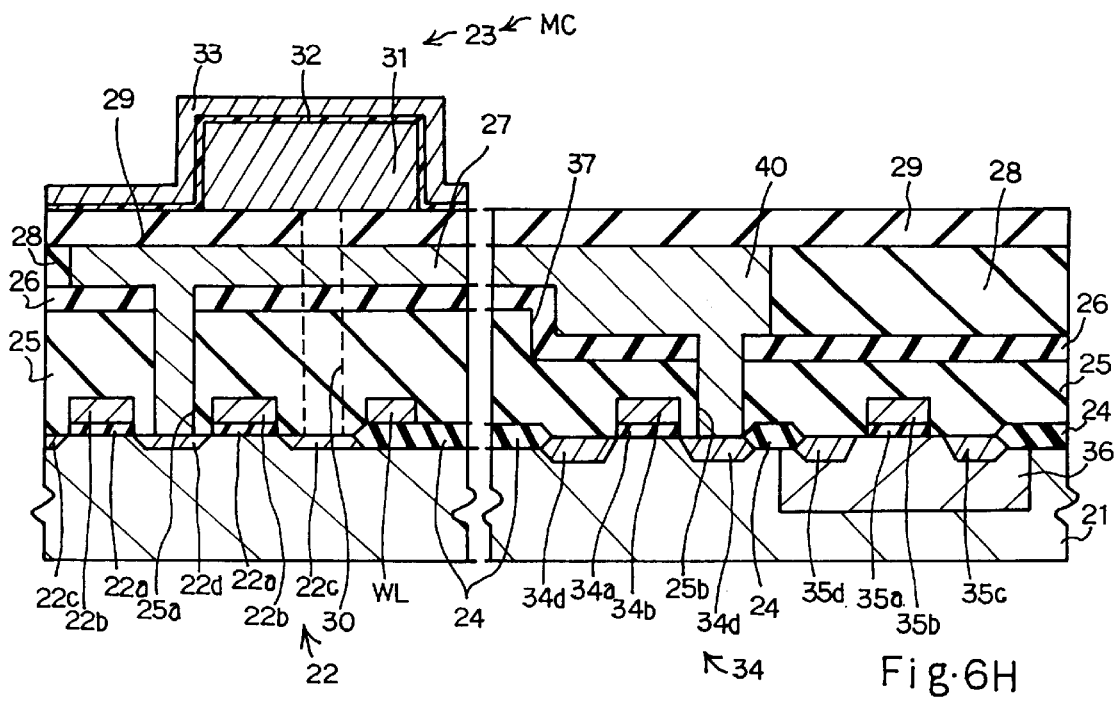

The resultant semiconductor structure is cleaned, and natural oxide is removed from the storage node electrode 31 in buffered hydrofluoric acid. Silicon nitride is deposited to 7 nanometers thick over the storage node electrode 31, and the silicon nitride layer is partially oxidized in wet ambience at 800 degrees in centigrade. Thus, the silicon nitride film is partially converted to a silicon oxide film. Finally, heavily-doped n-type polysilicon is deposited to 150 nanometers thick over the entire surface of the resultant semiconductor structure, and the composite layer of silicon nitride and silicon oxide and the heavily-doped n-type polysilicon layer are successively patterned into the dielectric layer 32 and the cell plate electrode 33 as shown in FIG. 6H.

Thereafter, an inter-level insulating layer, contact holes, metal wiring layers and a passivation layer are successively formed on the resultant semiconductor structure, and the semiconductor dynamic random access memory device is completed.

In this instance, the memory cells MC serve as a data storage means, and the first inter-level insulating layer 25 and the silicon nitride layer 26 form in combination a first inter-level insulating structure. The lightly-doped n-type drain regions 22d and the heavily-doped n-type drain region 34d serve as a first port and a second port, respectively, and the bit line 27 and the signal wiring layer 40 serve as a first conductive path and a second conductive path, respectively. The second inter-level insulating layer 28 and the third inter-level insulating layer 29 as a whole constitute a second inter-level insulating structure.

As will be appreciated from the foregoing description, the semiconductor dynamic random access memory device is fabricated through the process se- quence shown in FIGS. 6A to 6H. In the fabrication process, the step 37 is formed in the first inter-level insulating layer 25, and is transferred to the silicon nitride layer 26. The step 37 defines the grooves 53a/53b different in depth, and the bit line 27 and the signal wiring layer 40 different in thickness form each other are concurrently patterned in the grooves 53a/53b through the chemical mechanical polishing. The bit line 27 and the signal wiring layer 40 are coplanar with the second inter-level insulating layer 28. This results in large margin for the focus depth during the pattern transfer. For this reason, pattern images are exactly transferred to the photo-resist layer so as to pattern the conductive layer into the storage node electrode 31.

Second Embodiment

Figure 7:
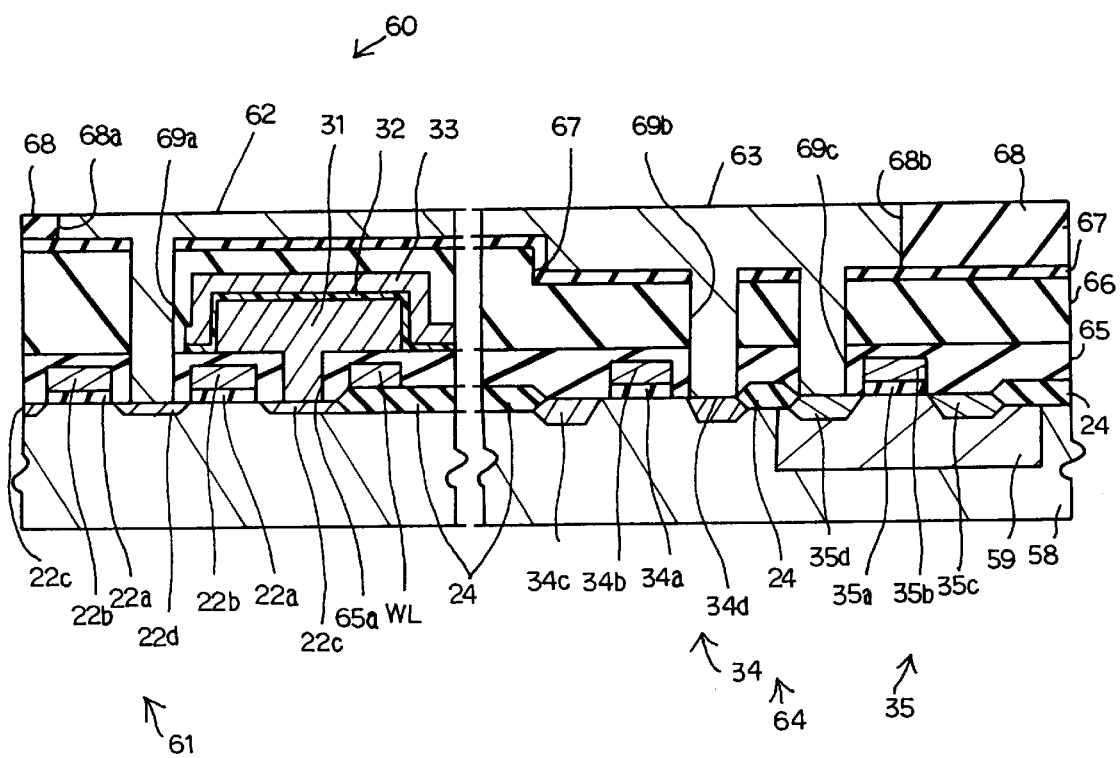
FIG. 7 is a cross sectional view showing the structure of another semiconductor dynamic random access memory device according to the present invention.

FIG. 7 illustrates another semiconductor dynamic random access memory device embodying the present invention, and the semiconductor dynamic random access memory device is fabricated on a p-type silicon substrate 58 with an n-type well 59. The semiconductor dynamic random access memory device shown in FIG. 7 is different from the semiconductor dynamic random access memory device shown in FIG. 4 in the location of a stacked storage capacitor 60. The stacked storage capacitor 60 is over the n-channel enhancement type field effect transistor 61, and is under a bit line 62 and a signal wiring layer 63. The stacked storage capacitor 60, the n-channel enhancement type field effect transistor 61 and a complementary transistor 64 are similar in structure to those of the first embodiment, and, for this reason, impurity regions, layers and electrodes of the circuit components 60, 61 and 64 are labeled with the same references designating corresponding impurity regions, layers and electrodes in the first embodiment without detailed description.

The field effect transistors 61, 34 and 35 are covered with a first inter-level insulating layer 65, and a bit contact hole 65a is formed in the first inter-level insulating layer 65. The lightly-doped n-type source region 22c is exposed to the bit contact hole 65a, and the storage node electrode 31 is held in contact with the lightly-doped n-type source region 22c.

The stacked storage capacitor 60 is provided on the first inter-level insulating layer 65, and is covered with a second inter-level insulating layer 66. The second inter-level insulating layer 66 around the stacked storage capacitor 60 is thicker than the second inter-level insulating layer 66 over the peripheral circuit 64, and a step 67a takes place. A silicon nitride layer 67 conformably extends on the second inter-level insulating layer 66, and the step 67a is transferred to the silicon nitride layer 67.

A third inter-level insulating layer 68 is formed on the silicon nitride layer 67, and a shallow groove 68a and a deep groove 68b are formed in the third inter-level insulating layer 68. A bit contact hole 69a and contact holes 69b/69c connects the shallow groove 68a and the deep groove 68b to the lightly-doped n-type drain region 22d and the heavily-doped n-type drain region/the heavily-doped n-type drain region 34d/35d. The bit line 62 is formed in the shallow groove 68a, and the signal wiring layer 63 is formed in the deep groove 68b. The bit line 62, the signal wiring layer 63 and the third inter-level insulting layer 68 are coplanar with one another. In this instance, the bit line 62 and the signal wiring layer 63 have the polyside structure or a multiple-layered structure having a tungsten film, a titanium nitride film and a refractory metal film such as titanium film, and the signal wiring layer 63 is 500 nanometers thick. The bit line 62 and the signal wiring layer 63 may be formed of titanium or have the polyside structure or a multiple-layered structure having a conductive metal film of aluminum or copper, a titanium nitride film and a titanium film. The titanium nitride film serves as a barrier metal layer, and prevents the n-type dopant impurity in the heavily-doped n-type drain region 34d and the p-type dopant impurity in the heavily-doped p-type drain region 35d from undesirable mixing with one another.

Description is hereinbelow made on a process for fabricating the semiconductor dynamic random access memory device shown in FIG. 7 with reference to FIGS. 8A to 8F. The process starts with preparation of the p-type silicon substrate 58, and the n-type well 59 is formed in the right portion of the p-type silicon substrate 58. The thick field oxide layer 24 is selectively grown to 300 nanometers thick on the p-type silicon substrate 51 and the n-type well 59 by using the LOCOS techniques, and defines the active areas. The active areas are thermally oxidized, and the gate insulating layers 22a, 34a and 35a are grown to 8 nanometers to 20 nanometers thick on the active areas.

Heavily-doped n-type polysilicon is deposited to 200 nanometers thick over the entire surface of the resultant semiconductor structure. A photo-resist etching mask (not shown) is patterned on the heavily-doped n-type polysilicon layer by using the photo-lithographic techniques.

Using the photo-resist etching mask, the heavily-doped n-type polysilicon layer is selectively etched away, and the word lines WL and the gate electrodes 34b/35b are formed. The word lines WL on the gate insulating layers 22a serve as gate electrodes 22b.

A photo-resist ion implantation mask (not shown) is patterned on the resultant semiconductor structure. The photo-resist ion implantation mask covers the active areas assigned to the peripheral circuit PC. Phosphorous is ion implanted into the active areas at dose of $1 \times 10^{13}$ cm$^{-2}$ to $5 \times 10^{13}$ cm$^{-2}$ under acceleration energy of 40 KeV, and the lightly-doped n-type source/drain regions 22c/22d are formed in the active areas in a self-aligned manner with the gate electrodes 22b. The photo-resist ion implantation mask is stripped off, and the gate insulating layer 22a, the gate electrode 22b and the lightly-doped n-type source/drain regions 22c/22d as a whole constitute the n-channel enhancement type field effect transistor 61.

Another photo-resist ion implantation mask (not shown) is patterned on the resultant semiconductor structure. The photo-resist ion implantation mask covers the active areas assigned to the memory cells MC and the n-type well 36, and the active area assigned to the n-channel enhancement type field effect transistor 34 is exposed to an opening of the photo-resist ion implantation mask. Phosphorous or arsenic is ion implanted into the active area $3 \times 10^{15}$ cm$^{-2}$ under acceleration energy of 50 KeV, and the heavily-doped n-type source/drain regions 34c/34d are formed in the active area in a self-aligned manner with the gate electrode 34b. The gate insulating layer 34a, the gate electrode 34b and the heavily-doped n-type source/drain regions 34c/34d as a whole constitute the n-channel enhancement type field effect transistor 34. The photo-resist ion implantation mask is stripped off.

Figure 8A:
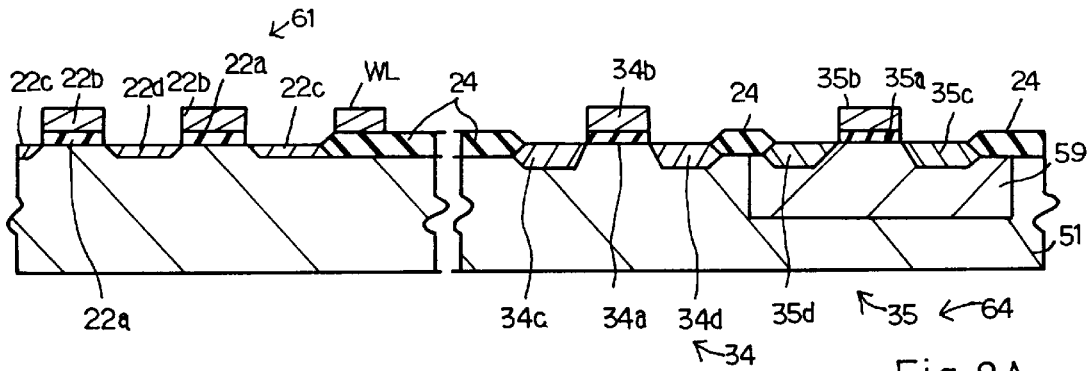
FIGS. 8A to 8F are cross sectional views showing another process for fabricating the semiconductor dynamic random access memory device.

Yet another photo-resist ion implantation mask (not shown) is patterned on the resultant semiconductor structure. The photo-resist ion implantation mask covers the active areas assigned to the memory cells MC and the n-channel enhancement type field effect transistor 34, and the active area assigned to the p-channel enhancement type field effect transistor 35 is exposed to an opening of the photo-resist ion implantation mask. Boron or boron difluoride is ion implanted into the active area $3 \times 10^{15}$ cm$^{-2}$ under acceleration energy of 50 KeV, and the heavily-doped p-type source/drain regions 35c/35d are formed in the active area in a self-aligned manner with the gate electrode 35b. The gate insulating layer 35a, the gate electrode 35b and the heavily-doped p-type source/drain regions 35c/35d as a whole constitute the p-channel enhancement type field effect transistor 35, and the n-channel enhancement type field effect transistor 34 and the p-channel enhancement type field effect transistor 35 form in combination the complementary transistor 64. The photo-resist ion implantation mask is stripped off. The resultant semiconductor structure is shown in FIG. 8A.

The n-channel enhancement type field effect transistors 61 and the complementary transistor 64 are covered with the first inter-level insulating layer 65. In this instance, the first inter-level insulating layer 65 is formed of insulating material in the silicon oxide system, and the insulating material is silicon oxide and boro-phosphosilicate glass. The resultant semiconductor structure is placed in a reactor of a low-pressure chemical vapor deposition system, gaseous mixture containing silane (SiH$_4$) and dinitrogen monoxide (N$_2$O) is introduced in reactor. The silane is pyrolized at 800 degrees in centigrade, and silicon oxide is deposited to 100 nanometers thick over the entire surface of the resultant semiconductor structure. Subsequently, gaseous mixture containing tetraethyl orthosilicate (Si(OC$_2$H$_5$)$_4$), phosphine (PH$_3$), trimethyl borate (B(OCH$_3$)$_3$) and oxygen (O$_2$) is introduced into the reactor, and boro-phosphosilicate glass is deposited to 600 nanometers thick over the silicon oxide layer. The boro-phosphosilicate glass layer is reflowed at 750 degrees to 900 degrees in centigrade, and the boro-phosphosilicate glass layer is 300 nanometers decreased in thickness by using a chemical mechanical polishing. In this way, the first inter-level insulating layer 65 is formed on the resultant semiconductor structure.

A photo-resist etching mask (not shown) is patterned on the first inter-level insulating layer 65 by using the photo-lithographic techniques, and the first inter-level insulating layer 65 is anisotropically etched away so as to form the node contact hole 65a. The lightly-doped n-type source region 22c is exposed to the node contact hole 65a.

Subsequently, heavily-doped n-type polysilicon is deposited over the entire surface of the resultant semiconductor structure. The heavily-doped n-type polysilicon fills the node contact hole 65a, and swells into a heavily-doped n-type polysilicon layer of 700 nanometers thick on the first inter-level insulating layer 65. A photo-resist etching mask (not show) is patterned on the heavily-doped n-type polysilicon layer by using the photo-lithographic techniques, and the heavily-doped n-type polysilicon layer is patterned into the storage node electrode 31. The storage node electrode 31 is electrically connected through the node contact hole 65a to the lightly-doped n-type source region 22c.

Figure 8B:
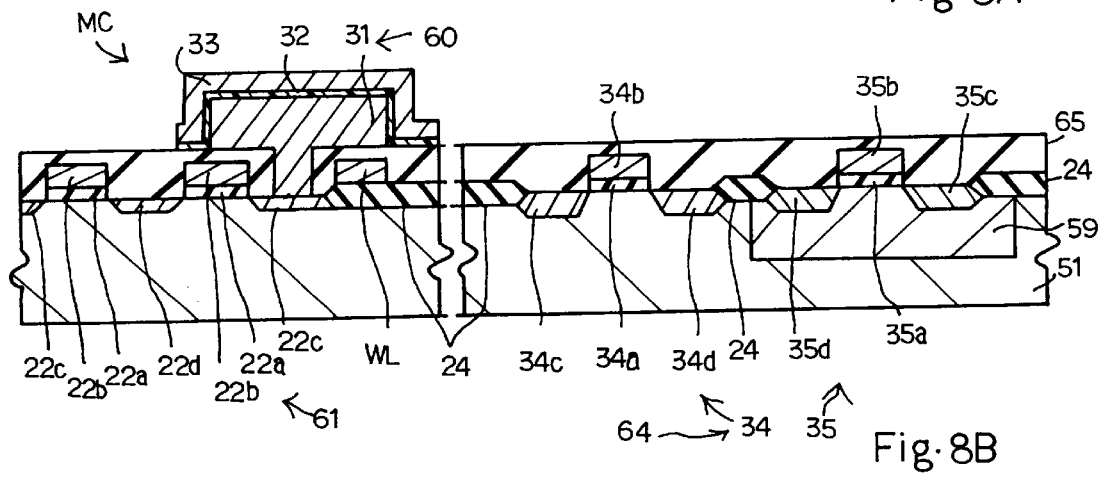

The resultant semiconductor structure is cleaned, and natural oxide is removed from the storage node electrode 31 in buffered hydrofluoric acid. Silicon nitride is deposited to 7 nanometers thick over the storage node electrode 31, and the silicon nitride layer is partially oxidized in wet ambience at 800 degrees in centigrade. Thus, the silicon nitride film is partially converted to a silicon oxide film. Heavily-doped n-type polysilicon is deposited to 150 nanometers thick over the entire surface of the resultant semiconductor structure, and the composite layer of silicon nitride and silicon oxide and the heavily-doped n-type polysilicon layer are successively patterned into the di-electric layer 32 and the cell plate electrode 33. The storage node electrode 31, the dielectric layer 32 and the cell plate electrode 33 as a whole constitute the stacked storage capacitor 60 as shown in FIG. 8B.

Figure 8C:
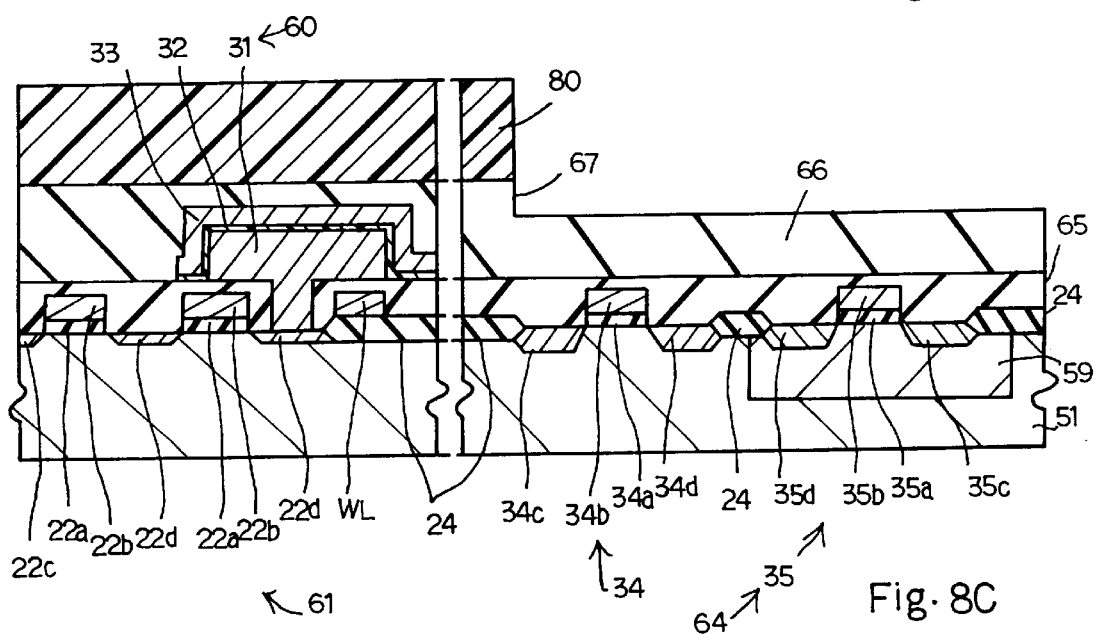

Boro-phosphosilicate glass is deposited over the entire surface of the resultant semiconductor structure, and forms a boro-phosphosilicate glass layer. The boro-phosphosilicate glass layer is reflowed. A photo-resist etching mask 80 is patterned on the boro-phosphosilicate glass layer by using the photo-lithographic techniques, and has an opening over the area assigned to the peripheral circuit. Using the photo-resist etching mask 80, the boro-phosphosilicate glass layer is partially etched away, and forms the step 67 as shown in FIG. 8C. Thus, the boro-phosphosilicate glass layer is formed into the second inter-level insulating layer 66.

The photo-resist etching mask 80 is stripped off, and silicon nitride is deposited to 100 nanometers thick by using the low-pressure chemical vapor deposition. The silicon nitride forms the silicon nitride layer 67 conformably extending on the second inter-level insulating layer 66, and the step 67 is transferred to the silicon nitride layer 67.

Figure 8D:
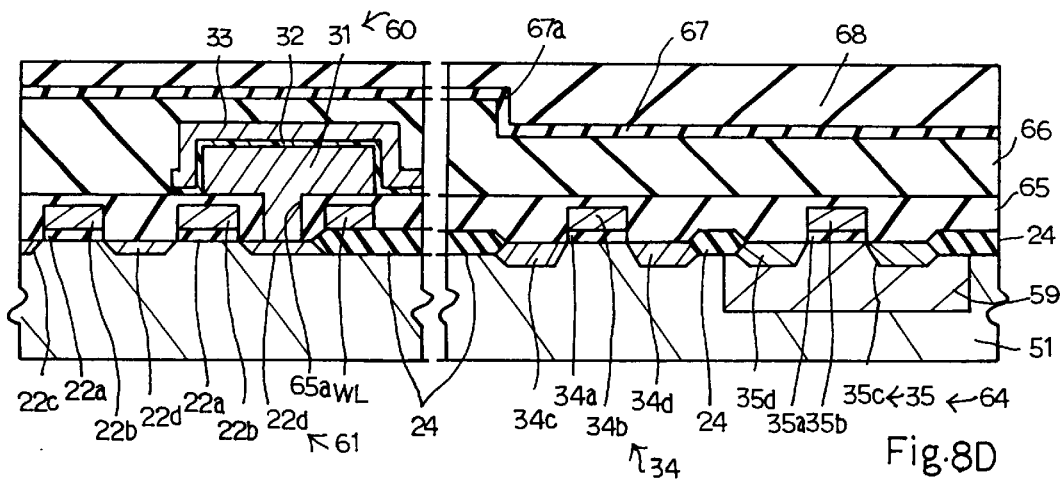

Boro-phosphosilicate glass is deposited to 500 nanometers thick over the silicon nitride layer 67, and forms the third inter-level insulating layer 68. The third inter-level insulating layer 68 is reflowed. The third inter-level insulating layer 68 is planarized through the chemical mechanical polishing as shown in FIG. 8D, and the thickness is decreased to 300 nanometers thick.

Figure 8E:
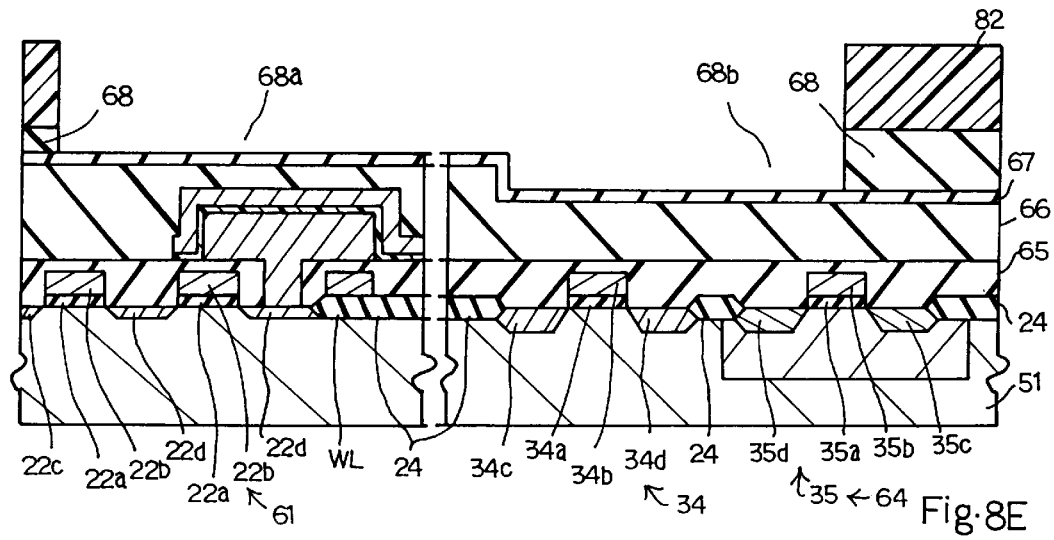

A photo-resist etching mask 82 is patterned on the third inter-level insulating layer 68 by using the photo-lithographic techniques, and has openings corresponding to the bit line 62 and the signal wiring layer 63. The third inter-level insulating layer 68 is anisotropically etched away until the silicon nitride layer 67 is exposed. The anisotropic etchant is in the fluoro-carbon system, which has large selectivity between the boro-phosphosilicate glass and the silicon nitride. Then, the shallow groove 68a and the deep groove 68b are formed in the third inter-level insulating layer 68 as shown in FIG. 8E. The photo-resist etching mask 82 is stripped off.

Figure 8F:
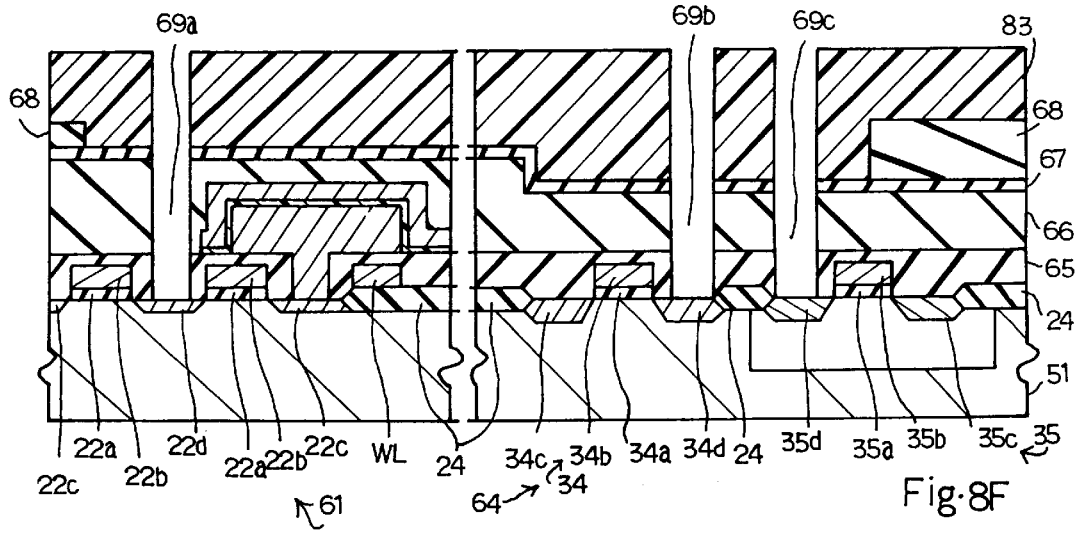

Another photo-resist etching mask 83 is patterned on the resultant semiconductor structure, and has opening over the lightly-doped n-type drain region 22d, the heavily-doped n-type drain region 34d and heavily-doped p-type drain region 35d. The silicon nitride layer 67, the second inter-level insulating layer 66 and the first inter-level insulating layer 65 are anisotropically etched so as to form 69a, 69b and 69c as shown in FIG. 8F.

Subsequently, titanium is deposited to 60 nanometers thick by using a sputtering or a chemical vapor deposition, titanium nitride is deposited to 100 nanometers thick by using a sputtering or a chemical vapor deposition and aluminum or copper is deposited to 500 nanometers to 1000 nanometers thick by using a sputtering or a chemical vapor deposition. The titanium film, the titanium nitride film and the aluminum/copper film form in combination a composite layer on the third inter-level insulating layer 68.

The composite layer is chemically mechanically polished until the third inter-level insulating layer 68 is exposed again, and is formed into the bit line 62 and the signal wiring layer 63. Though not shown in the drawings, the bit line 62 is arranged in parallel to other bit lines at intervals of 0.35 micron, and the signal wiring layer 63 is also arranged in parallel to other signal wiring layers.

The semiconductor dynamic random access memory device and the process implementing the second embodiment achieve all the advantages of the first embodiment. Moreover, the conditions of the heat treatment for the storage capacitor 60 are determined regardless of the bit line 62, and the heat treatment can be carried out more than 500 degrees in centigrade. Thus, the second embodiment is higher in flexibility in process conditions.

Although particular embodiments of the present invention have been shown and described, it will be obvious to those skilled in the art that various changes and modifications may be made without departing from the spirit and scope of the present invention.

For example, the bit line and the signal wiring layer may has a composite structure having a tungsten film, titanium nitride film and a titanium film or another composite structure having an aluminum/copper film, a titanium nitride film and a titanium film. In this instance, the titanium nitride layer serves as a barrier metal layer against diffusion of n-type/p-type dopant impurity from the heavily-doped n-type drain region 24d and the heavily-doped p-type drain region 35d. For this reason, the composite structure is desirable for the signal wiring layer 38 shown in FIG. 4. Otherwise, the bit line and the signal wiring layer may be formed of another refractory metal or other metal. In any case, it is necessary to limit the heat treatments below the melting point of the metal/refractory metal.

When the bit line 27 and the signal wiring layer 38 have the composite structure as shown in FIG. 4, the process is modified as follows. Contact holes are formed in the silicon nitride layer 29 and the first inter-level insulating layer 28 after the formation of the grooves 53a/53b, and the lightly-doped n-type drain region 22d, the heavily-doped n-type drain region 34d and the heavily-doped p-type drain region 35d are exposed to the contact holes, respectively. Titanium is deposited to 60 nanometers thick by using a sputtering or a chemical vapor deposition, titanium nitride is deposited to 100 nanometers thick by using a sputtering or a chemical vapor deposition, and aluminum or copper is deposited to 500 nanometers to 1000 nanometers thick by using a sputtering or a chemical vapor deposition. The composite layer is chemically mechanically polished until the second inter-level insulating layer 28 is exposed, and the bit line 27 and the signal wiring layer 38 are embedded in the second inter-level insulating layer 28. The third inter-level insulating layer 29 is formed on the bit line 27 and the signal wiring layer 40, and is planarized. The node contact hole 30 is formed by using the photo-lithographic techniques and the anisotropic etching, and the lightly-doped n-type drain region 22c is exposed to the node contact hole 30. Titanium is deposited to 60 nanometers thick by using the sputtering, titanium nitride is deposited to 100 nanometers thick by using the chemical vapor deposition, and tungsten is deposited to 700 nanometers thick by using a low-pressure chemical vapor deposition. The tungsten layer is patterned into the storage node electrode 31. Tantalum oxide ($Ta_2O_3$) is deposited to 8 nanometers thick over the entire surface of the resultant semiconductor structure, and is annealed in oxygen plasma at 100 degrees to 400 degrees in centigrade. Titanium nitride is deposited to 150 nanometers thick by using the chemical vapor deposition of the sputtering. The titanium nitride layer and the composite structure are selectively etched so as to form the dielectric layer 32 and the cell plate electrode 33 over the area assigned to the memory cell array. Thus, various kinds of material are available for the semiconductor dynamic random access memory device.

The bit line and the signal wiring layer different in thickness are available for another kind of semiconductor memory device such as, for example, a semiconductor static random access memory device or a semiconductor read only memory device.

What is claimed is:

1. A semiconductor memory device fabricated on a semiconductor substrate, comprising:
    a data storage means fabricated on a first portion of said semiconductor substrate for storing data information;
    a peripheral circuit fabricated on a second portion of said semiconductor substrate for controlling a data access to said data storage means;
    a first inter-level insulating structure formed on said first portion and said second portion of said semiconductor substrate, and having a plurality of contact holes reaching a first port of said data storage means assigned to a first signal representative of said data information and a second port of said peripheral circuit assigned to a second signal;
    a first conductive path extending on said first inter-level insulating structure over said first portion, electrically connected to said first port, and having a first thickness and a first upper surface; and
    a second conductive path extending on said first inter-level insulating structure over said second portion, electrically connected to said second port, and having a second thickness greater than said first thickness and a second upper surface substantially coplanar with said first upper surface.

2. The semiconductor memory device as set forth in claim 1, in which parasitic capacitance is a major factor for a signal propagation speed along said first conductive path, and resistance is a major factor for a signal propagation speed along said second conductive path.

3. The semiconductor memory device as set forth in claim 1, in which said data storage means includes a dynamic random access memory cell having a storage capacitor for storing a bit of data information in the form of electric charge and a switching transistor for providing a conductive channel between said storage capacitor and said first port.

4. The semiconductor memory device as set forth in claim 3, further comprising a second inter-level insulating structure formed on said first inter-level insulating structure in such a manner as to sandwich said first conductive path and said second conductive path between said first inter-level insulating structure and said second inter-level insulating structure, said storage capacitor being formed on said second inter-level insulating structure so as to pass through a node contact hole formed in said first inter-level insulating structure and said second inter-level insulating structure.

5. The semiconductor memory device as set forth in claim 3, in which said first inter-level insulating structure has a first inter-level insulating layer and a second inter-level insulating layer laminated on said first inter-level insulating layer, said first conductive path and said second conductive path are formed on said second inter-level insulating layer, and said storage capacitor is formed on said first inter-level insulating layer.

6. The semiconductor memory device as set forth in claim 1, in which said first conductive path and said second conductive path are formed of tungsten silicide.

7. The semiconductor memory device as set forth in claim 1, in which said first conductive path and said second conductive path have a multiple-layered structure having a polysilicon layer and a refractory metal silicide layer laminated on said polysilicon layer.

8. The semiconductor memory device as set forth in claim 1, in which said first conductive path and said second conductive path have a multiple-layered structure having a refractory metal layer, a refractory metal nitride layer laminated on said refractory metal layer and a metal layer laminated on said refractory metal nitride layer.

9. The semiconductor memory device as set forth in claim 8, in which said refractory metal layer and said refractory metal nitride layer are formed of titanium and titanium nitride, and said metal layer is formed of conductive metal selected from the group consisting of aluminum and copper.

10. A process for fabricating a semiconductor dynamic random access memory device, comprising the steps of:
    a) preparing a semiconductor substrate;
    b) fabricating a first kind of circuit component incorporated in a data storage means and a second kind of circuit component incorporated in a peripheral circuit on a first portion of said semiconductor substrate and a second portion of said semiconductor substrate, respectively.
    c) covering said first kind of circuit component and said second kind of circuit component with a first inter-level insulating structure having a step making said first inter-level insulating structure different in thickness between a first portion over said first portion of said semiconductor substrate and said second portion over said second portion of said semiconductor substrate;
    d) forming a second inter-level insulating layer on said first inter-level insulating structure;
    e) forming a first groove with a first depth located over said first portion of said first inter-level insulating structure, a second groove with a second depth greater than said first depth and located over said second portion of said first inter-level insulating structure, a first contact hole connecting said first groove to a first port of said first kind of circuit component and a second contact hole connecting said second groove to a second port of said second kind of circuit component in said second inter-level insulating layer;
    f) depositing conductive material in such a manner as to fill said first groove and said second groove and swell into a conductive layer on said second inter-level insulating layer; and
    g) uniformly removing said conductive layer until said second inter-level insulating layer is exposed, thereby leaving a first conductive path and a second conductive path different in thickness in said first groove and said second groove, respectively.

11. The process as set forth in claim 10, in which said first inter-level insulating structure has a first insulating layer having said step and a second insulating layer formed of a first insulating material and conformably extending on said first layer, and said second inter-level insulating layer is formed of a second insulating material etched by using an etchant having a selectively between said first insulating material and said second insulating material.

12. The process as set forth in claim 11, in which said step e) includes the sub-steps of
   e-1) forming a first etching mask on said second inter-level insulating layer having first openings over said first portion of said first inter-level insulating structure and said second portion of said first inter-level insulating structure,
   e-2) selectively removing said second inter-level insulating layer by using said etchant until said second insulating layer is exposed so as to form said first groove and said second groove,
   e-3) forming a second etching mask on the resultant structure of said step e-2) having second openings over said first port and said second port, and
   e-4) successively etching said second insulating layer and said first insulating layer for forming said first contact hole and said second contact hole.

13. The process as set forth in claim 10, further comprising the steps of
   h) forming a third inter-level insulating layer on said second inter-level insulating layer, said first conductive path and said second conductive path, and
   i) fabricating a third kind of circuit component incorporated in said data storage means on said third inter-level insulting layer and electrically connected through said third inter-level insulating layer, said second inter-level insulating layer and said first inter-level insulating structure to said first kind of circuit component.

14. The process as set forth in claim 13, in which said first kind of circuit component and said third kind of circuit component are a switching transistor and a storage capacitor.

15. The process as set forth in claim 10, in which said first kind of circuit component is a dynamic random access memory cell having a switching transistor and a storage capacitor coupled to said switching transistor.

16. The process as set forth in claim 15, in which said step b) includes the sub-steps of
   b-1) fabricating said switching transistor and said second kind of circuit component in said first portion of said semiconductor substrate and said second portion of said semiconductor substrate, respectively,
   b-2) covering said switching transistor and said second kind of circuit component with an insulating layer having a node contact hole reaching one of the source and drain regions of said switching transistor, and
   b-3) fabricating said storage capacitor on said insulating layer in such a manner as to be electrically connected through said node contact hole to said one of said-source and drain regions.

17. A semiconductor memory device, comprising:
   a substrate;
   a switching circuit formed on said substrate;
   a storage element coupled to said switching circuit to provide a memory cell;
   a bit line coupled to said switching circuit;
   a peripheral circuit, formed on said substrate and coupled to said memory cell to selectively provide data thereto and provide an output signal indicative thereof; and
   a signal line, coupled to said peripheral circuit, said signal line having a greater thickness than said bit line.

18. A semiconductor memory device, according to claim 17, wherein said storage element is a capacitor.

19. A semiconductor memory device, according to claim 18, wherein said capacitor includes a storage node electrode, a dielectric layer, and a cell plate electrode.

20. A semiconductor memory device, according to claim 19, wherein said bit line is disposed between said capacitor and said switching circuit.

21. A semiconductor memory device, according to claim 19, wherein said capacitor is disposed between said switching circuit and said bit line.

22. A semiconductor memory device, according to claim 17, wherein said switching circuit includes an FET.

23. A semiconductor memory device, according to claim 22, wherein said FET includes a lightly doped drain coupled to said bit line.

24. A semiconductor memory device, according to claim 17, wherein said peripheral circuit includes a heavily doped N-channel FET and a heavily doped P-channel FET.

25. A semiconductor memory device, according to claim 24, wherein said signal line is directly coupled to at least one of said FET's.

26. A semiconductor memory device, according to claim 25, wherein said signal line is directly coupled to both of said FET's.

27. A semiconductor memory device, according to claim 17, wherein said bit line and said signal line include at least one of tungsten silicide and a lamination of refractory metal silicide film and polysilicon film.

28. A semiconductor memory device, according to claim 17, wherein the thickness of said bit line is 200 nm and the thickness of said signal line is 500 nm.

29. A semiconductor memory device, according to claim 17, wherein said bit line and said signal line are disposed at a first level of the semiconductor memory device and said switching circuit and said peripheral circuit are disposed at a second level of the semiconductor memory device.

30. A semiconductor memory device, according to claim 29, further comprising:
   a first interlayer insulating layer, disposed at a third level of the semiconductor device between said first level and said second level, said first interlayer insulating layer having a first thickness at portions thereof corresponding to said bit line and having a second thickness at portions thereof corresponding to said signal line, wherein said first thickness is greater than said second thickness.

31. A semiconductor memory device, according to claim 30, further comprising:
   contact holes, disposed in said first interlayer insulating layer and corresponding to connections of said switching circuit and said peripheral circuit, said bit line and said signal line extending through said contact holes to connect to said switching circuit and said peripheral circuit, respectively.

32. A semiconductor memory device, according to claim 31, wherein two of said contact holes connect to different operative positions of said peripheral circuit.

33. A semiconductor memory device, according to claim 30, further comprising:
   a second interlayer insulating layer, disposed adjacent to said bit line and said signal line, wherein said bit line and said signal line are between said first and second interlayer insulating layers.

34. A semiconductor memory device, according to claim 33, wherein said storage element is disposed adjacent to said second interlayer insulating layer.

35. A semiconductor memory device, according to claim 34, wherein said second interlayer insulating layer is between said switching circuit and said storage element.

36. A semiconductor memory device, according to claim 34, wherein said storage element is between said second interlayer insulating layer and said switching circuit.

37. A semiconductor device, comprising:

a substrate;

a first circuit formed on said substrate;

a second circuit formed on said substrate;

first and second data lines, formed at a level of the semiconductor device, said first data line coupled to said first circuit and said second data line coupled to said second circuit, wherein said data lines have different thicknesses to minimize stray capacitance provided by said first data line to said first circuit and to minimize resistance provided by said second data line to said second circuit.

38. A semiconductor device, according to claim 37, wherein said first circuit is operatively coupled to said second circuit.

39. A semiconductor device, according to claim 38, wherein said first circuit is a switching circuit coupled to a storage element and said second circuit is a peripheral circuit for driving said switching circuit.

40. A semiconductor device, according to claim 39, wherein said storage element is disposed between said first data line and said switching circuit.

41. A semiconductor device, according to claim 39, wherein said first data line is disposed between said storage element and said switching circuit.

42. A method of forming a semiconductor device, comprising:

(a) forming a first circuit and a second circuit on a substrate; and (b) forming first and second data lines having different thicknesses at a level of the semiconductor device, said first data line being coupled to said first circuit and said second data line being coupled to said second circuit.

43. A method, according to claim 42, further comprising:

(c) prior to forming said first and second data lines, forming an interlayer insulating layer disposed between said circuits and said data lines, said interlayer insulating layer having a first portion corresponding to said first circuit and a second portion corresponding to said second circuit, wherein said first and second portions have different thicknesses.

44. A method, according to claim 43, wherein forming said interlayer insulating layer includes first creating a layer of insulating material having a uniform thickness and then etching a portion of said insulating material corresponding to one of said first and second portions of said interlayer insulating layer to provide a step therein.

45. A method, according to claim 44, wherein forming said first and second data lines includes providing a conductive layer that forms the different thicknesses of said data lines according to said step.

46. A method, according to claim 45, further comprising:

(d) prior to forming said data lines, forming contact holes in said interlayer insulating layer, said contact holes corresponding to connections of said first and second circuits, wherein portions of said conductive layer extend through said contact holes to connect said first data line to said first circuit and to connect said second data line to said second circuit.

47. A method, according to claim 46, wherein providing the conductive layer includes providing at least one of tungsten silicide and a lamination of refractory metal silicide film and polysilicon film.

48. A method, according to claim 42, wherein forming said first circuit includes forming a switching circuit of a semiconductor memory device and wherein forming said second circuit includes forming a peripheral circuit operatively coupled to said switching circuit.

49. A method according to claim 48, further comprising:

(c) forming a storage element operatively coupled to said switching circuit.

50. A method, according to claim 49, wherein forming said first data line includes forming said first data line between said storage element and said switching circuit.

51. A method, according to claim 49, wherein forming said storage element includes forming said storage element between said switching circuit and said first data line.

* * * * *